US009397222B2

(12) United States Patent
Koyama et al.

(10) Patent No.: US 9,397,222 B2
(45) Date of Patent: Jul. 19, 2016

(54) DISPLAY DEVICE AND ELECTRONIC DEVICE

(75) Inventors: Jun Koyama, Kanagawa (JP); Toru Tanabe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/466,635

(22) Filed: May 8, 2012

(65) Prior Publication Data

US 2012/0286262 A1   Nov. 15, 2012

(30) Foreign Application Priority Data

May 13, 2011   (JP) .................... 2011-108664

(51) Int. Cl.
*H01L 29/10*   (2006.01)
*H01L 29/786*   (2006.01)
*H01L 27/12*   (2006.01)

(52) U.S. Cl.
CPC ........ *H01L 29/7869* (2013.01); *H01L 27/1225* (2013.01)

(58) Field of Classification Search
CPC ............. H01L 29/7869; H01L 29/78606; H01L 29/78603
USPC ........................................... 257/43
See application file for complete search history.

(56) References Cited

U.S. PATENT DOCUMENTS

| 5,528,032 | A | 6/1996 | Uchiyama |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Tucker J Wright
*Assistant Examiner* — Mark Hatzilambrou
(74) *Attorney, Agent, or Firm* — Eric J. Robinson; Robinson Intellectual Property Law Office, P.C.

(57) ABSTRACT

An object is, in a structure where switch circuits in a signal line driver circuit is placed over the same substrate as a pixel portion, to reduce the size of transistors in the switch circuits and to reduce load in the circuits during charging and discharging of signal lines due to the supply of data. A display device is provided which includes a pixel portion receiving a video signal, and a signal line driver circuit including a switch circuit portion configured to control output of the video signal to the pixel portion. The switch circuit portion includes a transistor over an insulating substrate. The transistor has a field-effect mobility of at least 80 $cm^2/Vs$ or more. The transistor includes an oxide semiconductor layer.

22 Claims, 19 Drawing Sheets

(56) References Cited

U.S. PATENT DOCUMENTS

| | | | |
|---|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,115,883 B2 | 2/2012 | Yamazaki et al. |
| 8,143,115 B2 | 3/2012 | Omura et al. |
| 8,148,721 B2 | 4/2012 | Hayashi et al. |
| 8,158,974 B2 | 4/2012 | Yano et al. |
| 8,333,913 B2 | 12/2012 | Inoue et al. |
| 8,488,077 B2 | 7/2013 | Yamazaki et al. |
| 8,668,849 B2 | 3/2014 | Inoue et al. |
| 8,698,970 B2 | 4/2014 | Yamazaki et al. |
| 8,779,419 B2 | 7/2014 | Yano et al. |
| 8,809,928 B2 | 8/2014 | Sakata |
| 8,879,011 B2 | 11/2014 | Yamazaki et al. |
| 8,994,889 B2 | 3/2015 | Yamazaki et al. |
| 9,024,312 B2 | 5/2015 | Fukuda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0268210 A1 | 11/2007 | Uchino et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224872 A1* | 9/2010 | Kimura .......................... 257/43 |
| 2011/0062435 A1 | 3/2011 | Yamazaki et al. |
| 2011/0084266 A1* | 4/2011 | Yamazaki et al. ............. 257/43 |
| 2012/0012847 A1 | 1/2012 | Koyama et al. |
| 2012/0018727 A1 | 1/2012 | Endo et al. |
| 2012/0032161 A1* | 2/2012 | Matsubayashi .... G11C 16/0433 257/43 |
| 2012/0168750 A1 | 7/2012 | Hayashi et al. |
| 2012/0280715 A1 | 11/2012 | Sekine |
| 2012/0281469 A1 | 11/2012 | Tomatsu et al. |
| 2012/0287027 A1* | 11/2012 | Koyama ........................ 345/80 |
| 2015/0084048 A1 | 3/2015 | Hayashi et al. |
| 2015/0179675 A1 | 6/2015 | Yamazaki et al. |
| 2015/0303072 A1 | 10/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-309949 A | 11/2004 |
| JP | 2007-194594 A | 8/2007 |
| JP | 2007-310311 A | 11/2007 |
| JP | 2008-166716 A | 7/2008 |
| JP | 2011-071503 A | 4/2011 |
| JP | 2011-097007 A | 5/2011 |
| JP | 2011-192958 A | 9/2011 |
| WO | WO-2004/114391 | 12/2004 |
| WO | WO-2008/069056 | 6/2008 |
| WO | WO-2008/069255 | 6/2008 |

(56) References Cited

FOREIGN PATENT DOCUMENTS

| WO | WO-2008/114588 | 9/2008 |
|----|----------------|--------|
| WO | WO-2008/117739 | 10/2008 |
| WO | WO-2011/033993 | 3/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-868.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $INGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystaline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase, ", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B. (Physical Review. B), 2008, vol. 77, pp. 245202-1-245202-6.
Orita.M et al., "Amorphous transparent conductive oxide InGaO3(ZnO)m (m<4):a Zn4s conductor,", Philosphical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vaccum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Phyics Letters) , Sep. 1, 2003, vol. 83, No. 9, pp. 1755-1757.

* cited by examiner

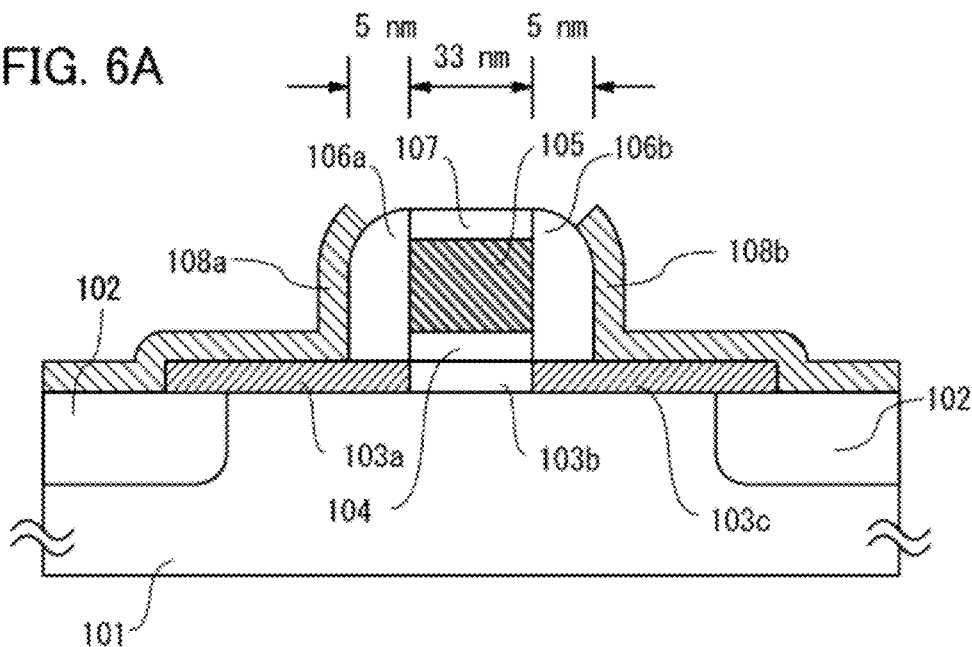
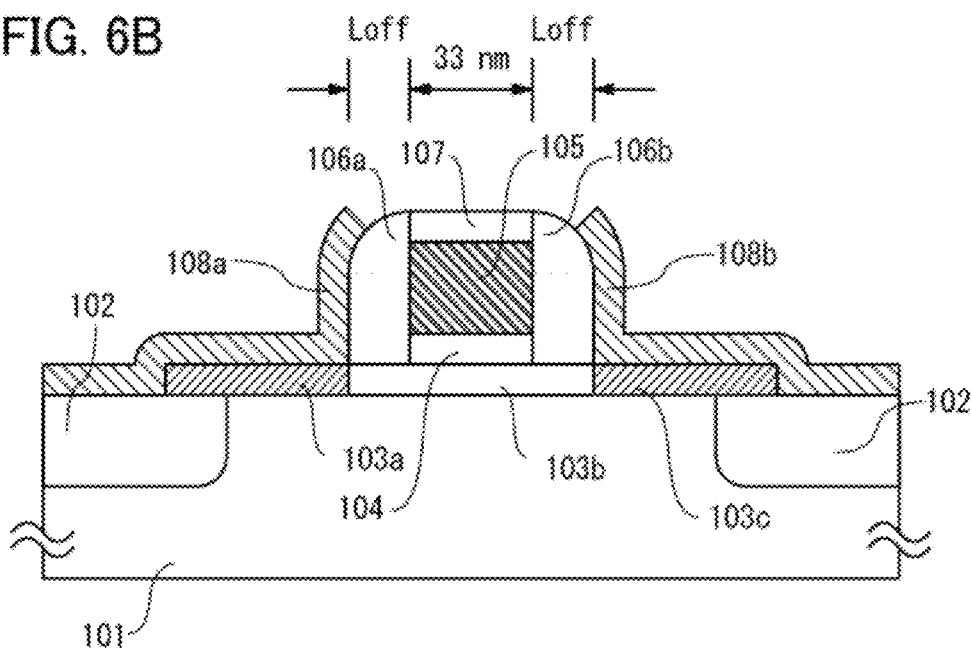

● In
☾ Sn
⟨ Zn
● O

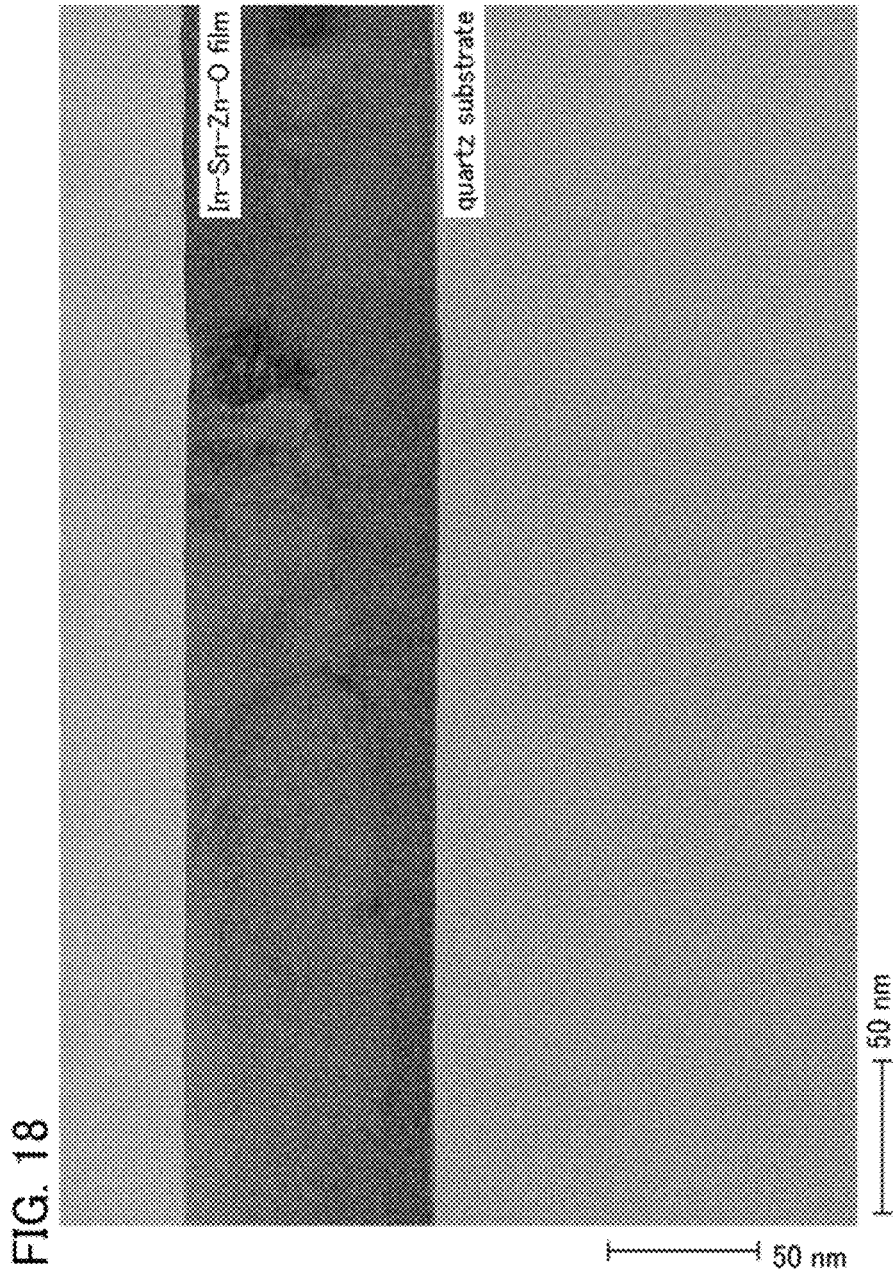

DISPLAY DEVICE AND ELECTRONIC DEVICE

BACKGROUND OF THE INVENTION

1. Field of the Invention

The present invention relates to a display device and an electronic device including the display device.

2. Description of the Related Art

With the widespread use of large display devices such as liquid crystal televisions, display devices are required to be higher-value-added and thus are under development. Particularly, a technique to form a driver circuit or part of a driver circuit over a substrate, where a pixel portion is formed, using thin film transistors (TFTs) whose channel region is formed using an amorphous semiconductor or a microcrystalline semiconductor is actively developed because the technique greatly helps a reduction in cost and improvement in reliability.

Instead of forming a signal line driver circuit (a source driver) over a substrate where a pixel portion is formed, in a display device using transistors whose channel regions are formed using an amorphous semiconductor or a microcrystalline semiconductor, by using a technique called COG (chip on glass) or COF (chip on film), a video signal is input from a driving IC through connection terminals which are provided as many as signal lines. The number of the connection terminals which are provided as many as the signal lines is increased as the number of the signal lines is increased, which causes a rise of cost. Patent Document 1 discloses a structure in which three analog switches are provided for signal lines in a signal line driver circuit and are provided over the same substrate as a pixel portion and one horizontal scanning period has three writing periods.

In recent years, display devices in which light emitting elements such as EL elements are driven (EL display devices) have been actively developed. Patent Document 2 discloses a structure of a pixel circuit in which the number of transistors provided in a pixel is reduced and variations in threshold voltage and field-effect mobility between the transistors can be compensated.

REFERENCE

Patent Document

[Patent Document 1] Japanese Published Patent Application No. 2004-309949

[Patent Document 2] Japanese Published Patent Application No. 2007-310311

SUMMARY OF THE INVENTION

Like liquid crystal displays the size of which has been already increased, EL display devices will probably be put under development aimed at increasing panel size. With an increase in panel size, the number of pieces of data input to signal lines is increased. Possible solutions to this problem include a structure in which the number of pieces of data sampled during one horizontal scan period is increased by providing analog switches, which are switch circuits, in a signal line driver circuit as described in Patent Document 1.

However, in the case where the analog switch is placed over the same substrate as the pixel portion, if a transistor used as the analog switch has a channel region of an amorphous semiconductor or a microcrystalline semiconductor, the transistor has insufficient field-effect mobility. Therefore, the channel width of the transistor is necessarily increased in order to increase the amount of the current flowing through the transistor. This increases the area of the transistor and the percentage of the load due to the transistor in the circuit.

An object of one embodiment of the present invention is, in a structure where switch circuits in a signal line driver circuit is placed over the same substrate as a pixel portion, to reduce the size of transistors in the switch circuits and to reduce load in the circuits during charging and discharging of signal lines due to the supply of data.

One embodiment of the present invention is a display device including a pixel portion receiving a video signal, and a signal line driver circuit including a switch circuit portion configured to control output of the video signal to the pixel portion. The switch circuit portion includes a transistor over an insulating substrate. The transistor has a field-effect mobility of at least 80 cm$^2$/Vs or more. The transistor includes an oxide semiconductor layer.

In a display device according to one embodiment of the present invention, the transistor preferably has a field-effect mobility of 120 cm$^2$/Vs or more.

In a display device according to one embodiment of the present invention, the pixel portion preferably includes a pixel provided with a transistor including an oxide semiconductor layer.

In a display device according to one embodiment of the present invention, the oxide semiconductor layer preferably includes at least a channel formation region overlapping with a gate electrode layer with a gate insulating layer therebetween.

In a display device according to one embodiment of the present invention, the oxide semiconductor layer is preferably a highly-purified oxide semiconductor layer.

In a display device according to one embodiment of the present invention, the highly-purified oxide semiconductor layer is preferably made of an oxide semiconductor containing at least one element selected from the group consisting of In, Sn, and Zn.

In one embodiment of the present invention, a way to improve the field-effect mobility is supplying oxygen to an oxide semiconductor in the transistor with an insulating film in the vicinity of the oxide semiconductor or/and supplying oxygen to an oxide semiconductor in the transistor through ion implantation to reduce oxygen deficiency part of which generates a carrier. Another way to improve the field-effect mobility is highly purifying the oxide semiconductor in a process for manufacturing the transistor to reduce the concentration of hydrogen, part of which generates a carrier, to an extremely low level.

A detail description is given below of a process for manufacturing a transistor formed using an oxide semiconductor according to one embodiment of the present invention with reference to cross-sectional views of FIGS. 1A to 1D.

First, a base insulating film 10 that releases oxygen when undergoing heat treatment is formed, and an oxide semiconductor film 11 is stacked over the base insulating film 10 (FIG. 1A). Then, a stack of the base insulating film 10 and the oxide semiconductor film 11 is subjected to a first heat treatment (FIG. 1B).

When an insulating film from which oxygen is released by heat treatment is provided as the base insulating film 10 serving as a gate insulating film and the like, oxygen deficiency caused in the oxide semiconductor film 11 can be repaired by heat treatment in a later step. Oxygen deficiency in the oxide semiconductor film 11 partly generates a carrier, which can cause a variation in the threshold voltage of the obtained transistor.

In addition, when the base insulating film 10 from which oxygen is released by heat treatment is provided, interface state between the base insulating film 10 and the oxide semiconductor film 11 can be reduced. An interface state traps an electric charge generated as a result of operation of the obtained transistor in some cases and thus can be a factor that causes a reduction in reliability of the transistor.

Note that the base insulating film 10 is preferably flat. Specifically, the base insulating film 10 has an average surface roughness ($R_a$) of 1 nm or less, preferably 0.3 nm or less, further preferably 0.1 nm or less. The base insulating film 10 may be subjected to planarization treatment such as chemical mechanical polishing (CMP) treatment. When the base insulating film 10 is flat, the state of an interface between the base insulating film 10 and the oxide semiconductor film 11 is favorable, whereby field-effect mobility can be increased and a variation in the threshold voltage can be reduced in the obtained transistor.

It is particularly preferable that the oxide semiconductor film 11 be formed using an In—Sn—Zn-based oxide because it increases the field-effect mobility and reliability of the transistor. Examples of other oxides producing similar effects include a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and a one-component metal oxide such as In-based oxide, Sn-based oxide, Zn-based oxide.

Note that the oxide semiconductor film 11 is preferably formed while the substrate is heated because in that case, the obtained transistor can have increased field-effect mobility. Substrate heating temperature at the time of formation of the oxide semiconductor film 11 is higher than or equal to 100° C. and lower than or equal to 600° C., preferably higher than or equal to 150° C. and lower than or equal to 550° C., further preferably higher than or equal to 200° C. and lower than or equal to 500° C. The oxide semiconductor film 11 is preferably formed by a sputtering method.

Note that the band gap of the oxide semiconductor film 11 is 2.5 eV or more, preferably 2.8 eV or more, further preferably 3.0 eV or more. When the band gap of the oxide semiconductor film 11 is in the above range, the transistor can have extremely low off-state current.

Note that the oxide semiconductor film 11 is in a single crystal state, a polycrystalline (also referred to as polycrystal) state, an amorphous state, or the like. Preferably, a c-axis aligned crystalline oxide semiconductor (CAAC-OS) film can be used as the oxide semiconductor film 11.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between the amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

The first heat treatment is performed in a reduced-pressure atmosphere (10 Pa or lower), an inert atmosphere (an atmosphere of an inert gas such as nitrogen or a rare gas), or an oxidizing atmosphere (an atmosphere containing an oxidizing gas such as oxygen, ozone, or nitrous oxide at 10 ppm or more) at a temperature higher than or equal to 250° C. and lower than or equal to 650° C., preferably higher than or equal to 300° C. and lower than or equal to 600° C.

By the first heat treatment, the concentration of impurities such as hydrogen in the oxide semiconductor film 11 can be reduced. Alternatively, the state of the interface between the base insulating film 10 and the oxide semiconductor film 11 can be made favorable. Since the first heat treatment is performed after the oxide semiconductor film 11 is formed, outward diffusion of oxygen that is released from the base insulating film 10 can be prevented. Note that it is alternatively possible that heat treatment is performed in an inert atmosphere or a reduced-pressure atmosphere, the atmosphere is then changed to an oxidizing atmosphere without changing the temperature, and heat treatment is performed in the oxidizing atmosphere. When the first heat treatment is performed in this manner, impurities in the oxide semiconductor film 11 can be reduced in the inert atmosphere or the reduced-pressure atmosphere and then oxygen deficiency caused at the time of removal of impurities can be reduced in the oxidizing atmosphere.

Note that a gas containing fewer impurities is used for the heat treatment and film formation. Specifically, a gas whose dew point is −70° C. or lower can be used.

After the first heat treatment, the oxide semiconductor film 11 is processed into an island-shaped oxide semiconductor film 12. Processing of the oxide semiconductor film 12 can be performed in such a manner that a resist mask is formed with the use of a photomask and a part in which the resist mask is not formed is etched by a dry etching method or a wet etching method. Such a process is called photolithography process.

Then, a conductive film is formed and processed by a photolithography process, so that a source electrode 13A and a drain electrode 13B which are at least partly in contact with the oxide semiconductor film are formed.

Next, an upper insulating film 14 serving as an interlayer insulating film is formed (FIG. 1C). It is preferable that an insulating film from which oxygen is released by heat treatment be used as the upper insulating film 14.

Next, second heat treatment is performed (FIG. 1D). The second heat treatment can be performed under a condition similar to that of the first heat treatment. By the second heat treatment, oxygen is released from the base insulating film 10 and the upper insulating film 14, so that oxygen deficiency in the island-shaped oxide semiconductor film 12 can be reduced. Moreover, interface state between the base insulating film 10 and the island-shaped oxide semiconductor film 12 and interface state between the island-shaped oxide semiconductor film 12 and the upper insulating film 14 can be reduced, whereby in the obtained transistor, field-effect mobility can be increased, a variation in threshold voltage can be reduced and the reliability can be improved.

In the above-described manner, a highly reliable transistor can be manufactured which includes an oxide semiconductor and has high field-effect mobility and in which a variation in threshold voltage is small.

Note that it is preferable that an interlayer insulating film be additionally formed to cover the transistor. By the interlayer insulating film, outward diffusion of oxygen that is released from the base insulating film 10 and the upper insulating film 14 from the transistor can be prevented. In the case where the interlayer insulating film is provided, the second heat treatment may be performed after formation of the interlayer insulating film.

A transistor which is obtained in the above manner has high field-effect mobility (e.g., a field-effect mobility of 31 cm$^2$/Vs or more), a small variation in threshold voltage, high reliability (e.g., a fluctuation range of threshold voltage by a negative BT test is 1 V or less), and extremely low off-state current.

A description will be given of the reason that highly purifying an oxide semiconductor increases the field-effect mobility of an insulated gate transistor.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as Formula 1.

$$\mu = \mu_0 \exp\left(-\frac{E}{kT}\right) \quad \text{[Formula 1]}$$

Here, E represents the height of the potential barrier, k represents the Boltzmann constant, and T represents the absolute temperature. When the potential barrier is assumed to be attributed to a defect, the height E of the potential barrier can be expressed as Formula 2 according to the Levinson model.

$$E = \frac{e^2 N^2}{8\varepsilon n} = \frac{e^3 N^2 t}{8\varepsilon C_{ox} V_g} \quad \text{[Formula 2]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer.

The drain current $I_d$ in a linear region can be expressed as Formula 3.

$$I_d = \frac{W \mu_0 V_g V_d C_{ox}}{L} \exp\left(-\frac{E}{kT}\right) \quad \text{[Formula 3]}$$

Here, L represents the channel length and W represents the channel width, and L and W are each 10 μm. Further, $V_d$ represents the drain voltage.

When dividing both sides of the above equation by $V_g$ and then taking logarithms of both sides, Formula 4 can be obtained.

$$\ln\left(\frac{I_d}{V_g}\right) = \ln\left(\frac{W \mu_0 V_d C_{ox}}{L}\right) - \frac{E}{kT}$$

$$= \ln\left(\frac{W \mu_0 V_d C_{ox}}{L}\right) - \frac{e^3 N^2 t}{8kT\varepsilon C_{ox} V_g} \quad \text{[Formula 4]}$$

The right side of Formula 4 is a function of $V_g$. From the formula, it is found that the defect density N can be obtained from the slope of a line in a graph which plots actual measured values and where the ordinate represents $\ln(I_d/V_g)$ and the abscissa represents $1/V_g$. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}$/cm$^2$.

On the basis of the defect density obtained in this manner, $\mu_0$ can be calculated to be 120 cm$^2$/Vs from Formula 1 and Formula 2. The measured mobility of an In—Sn—Zn oxide including a defect is approximately 40 cm$^2$/Vs. However, assuming that no defect exists inside the semiconductor and at the interface between the semiconductor and an insulating film, the mobility $\mu$ of the oxide semiconductor is expected to be 120 cm$^2$/Vs.

Note that even when no defect exists inside a semiconductor, scattering at the interface between a channel and a gate insulating film adversely affects the transport property of the transistor. In other words, the mobility $\mu_1$ at a position that is distance x away from the interface between the channel formation region and the gate insulating film can be expressed as Formula 5.

$$\frac{1}{\mu_1} = \frac{1}{\mu_0} + \frac{D}{B} \exp\left(-\frac{x}{l}\right) \quad \text{[Formula 5]}$$

Here, D represents the electric field in the gate direction, and B and l are constants. Note that B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of Formula 5 is increased and accordingly the mobility $\mu_1$ is decreased.

FIG. 2 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 2, the mobility has a peak of 100 cm$^2$/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 3A to 3C, FIGS. 4A to 4C, and FIGS. 5A to 5C. FIGS. 6A and 6B illustrate cross-sectional structures of the transistors used for the calculation. The transistors illustrated in FIGS. 6A and 6B each include a semiconductor region 103a and a semiconductor region 103c that have n$^+$-type conductivity in an oxide semiconductor layer. The resistivity of the semiconductor regions 103a and 103c is 2×10$^{-3}$ Ωcm.

The transistor in FIG. 6A is formed over a base insulating layer 101 and an embedded insulating layer 102 that is embedded in the base insulating layer 101 and formed of aluminum oxide. The transistor includes the semiconductor region 103a, the semiconductor region 103c, an intrinsic semiconductor region 103b that is placed between the semiconductor regions 103a and 103c and serves as a channel formation region, and a gate 105. The width of the gate 105 is 33 nm.

A gate insulating film 104 is formed between the gate 105 and the semiconductor region 103b. A sidewall insulating layer 106a and a sidewall insulating layer 106b are formed on both side surfaces of the gate 105, and an insulating layer 107 is formed over the gate 105 so as to prevent a short circuit between the gate 105 and another wiring. The sidewall insulating layer has a width of 5 nm. A source 108a and a drain 108b are provided in contact with the semiconductor region 103a and the semiconductor region 103c, respectively. Note that the channel width of this transistor is 40 nm.

The transistor in FIG. 6B is the same as the transistor in FIG. 6A in that it is formed over the base insulating layer 101 and the embedded insulating layer 102 formed of aluminum oxide and that it includes the semiconductor region 103a, the semiconductor region 103c, the intrinsic semiconductor region 103b provided therebetween, the gate 105 having a width of 33 nm, the gate insulating film 104, the sidewall insulating layer 106a, the sidewall insulating layer 106b, the insulating layer 107, the source 108a, and the drain 108b.

The difference between the transistor in FIG. 6A and the transistor in FIG. 6B is the conductivity type of semiconductor regions under the sidewall insulating layers 106a and 106b. In the transistor in FIG. 6A, the semiconductor regions under the sidewall insulating layer 106a and the sidewall insulating layer 106b are part of the semiconductor region 103a having n$^+$-type conductivity and part of the semiconductor region 103c having n$^+$-type conductivity, whereas in the transistor in FIG. 6B, the semiconductor regions under the sidewall insulating layer 106a and the sidewall insulating layer 106b are part of the intrinsic semiconductor region 103b. In other words, a region having a width of $L_{off}$ which overlaps with neither the semiconductor region 103a (the semiconductor region 103c) nor the gate 105 is provided. This region is called an offset region, and the width $L_{off}$ is called an offset length. As is seen from the drawing, the offset length is equal to the width of the sidewall insulating layer 106a (the sidewall insulating layer 106b).

The other parameters used in calculation are as described above. For the calculation, device simulation software Sentaurus Device manufactured by Synopsys, Inc. was used. FIGS. 3A to 3C show the gate voltage ($V_g$: a potential difference between the gate and the source) dependence of the drain current ($I_d$, a solid line) and the mobility (μ, a dotted line) of the transistor having the structure illustrated in FIG. 6A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 3A shows the gate voltage dependence of the transistor in the case where the thickness of the gate insulating layer is 15 nm, FIG. 3B shows that of the transistor in the case where the thickness of the gate insulating layer is 10 nm, and FIG. 3C shows that of the transistor in the case where the thickness of the gate insulating layer is 5 nm. As the gate insulating layer becomes thinner, the drain current $I_d$ in the off state (off-state current) in particular is significantly decreased. In contrast, there is no noticeable change in the peak value of the mobility μ and the drain current $I_d$ in an on state (on-state current). The graphs show that the drain current exceeds 10 μA at a gate voltage of around 1 V.

FIGS. 4A to 4C show the gate voltage $V_g$ dependence of the drain current $I_d$ (a solid line) and the mobility μ (a dotted line) of the transistor having the structure in FIG. 6B and an offset length $L_{off}$ of 5 nm. The drain current $I_d$ is obtained by calculation under the assumption that the drain voltage $V_d$ is +1 V and the mobility μ is obtained by calculation under the assumption that the drain voltage is +0.1 V. FIG. 4A shows the gate voltage dependence of the transistor in the case where the thickness of the gate insulating layer is 15 nm, FIG. 4B shows that of the transistor in the case where the thickness of the gate insulating layer is 10 nm, and FIG. 4C shows that of the transistor in the case where the thickness of the gate insulating layer is 5 nm.

FIGS. 5A to 5C show the gate voltage dependence of the drain current $I_d$ (a solid line) and the mobility μ (a dotted line) of the transistor having the structure in FIG. 6B and an offset length $L_{off}$ of 15 nm. The drain current $I_d$ is obtained by calculation under the assumption that the drain voltage $V_d$ is +1 V and the mobility μ is obtained by calculation under the assumption that the drain voltage is +0.1 V. FIG. 5A shows the gate voltage dependence of the transistor in the case where the thickness of the gate insulating layer is 15 nm, FIG. 5B shows that of the transistor in the case where the thickness of the gate insulating layer is 10 nm, and FIG. 5C shows that of the transistor in the case where the thickness of the gate insulating layer is 5 nm.

In both of the structures, as the gate insulating layer becomes thinner, the off-state current is significantly decreased, whereas no noticeable change arises in the peak value of the mobility μ and the on-state current.

Note that the peak of the mobility μ is approximately 80 cm$^2$/Vs in FIGS. 3A to 3C, approximately 60 cm$^2$/Vs in FIGS. 4A to 4C, and approximately 40 cm$^2$/Vs in FIGS. 5A to 5C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

The above-described transistor including a highly purified oxide semiconductor in a channel formation region has a field-effect mobility of as high as 80 cm$^2$/Vs or more or 120 cm²/Vs, so that the transistor can have a high current supply capability even when formed over the same insulated substrate as the pixel portion.

According to one embodiment of the present invention, transistors in switch circuit portions in a signal line driver circuit can be reduced in size and adequate charging and discharging of a signal line can be achieved.

BRIEF DESCRIPTION OF THE DRAWINGS

FIGS. 6A and 6B illustrate cross-sectional structures of transistors used for calculation.

FIG. 18 is a cross-sectional TEM image of an In—Sn—Zn-based oxide film.

DETAILED DESCRIPTION OF THE INVENTION

Figure 1A:
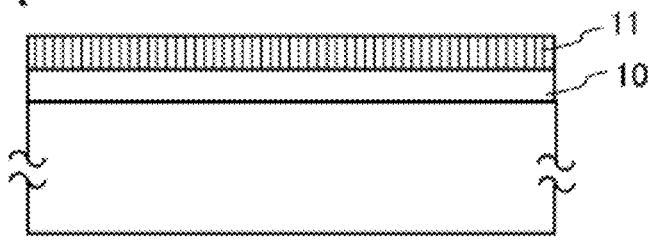
FIGS. 1A to 1D are cross-sectional views illustrating one embodiment of the present invention.
Figure 1B:
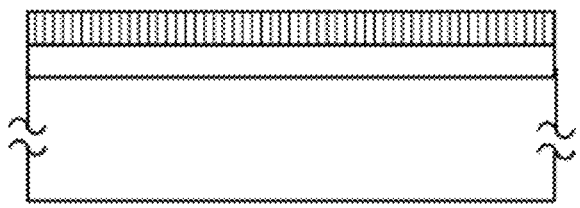
Figure 1C:
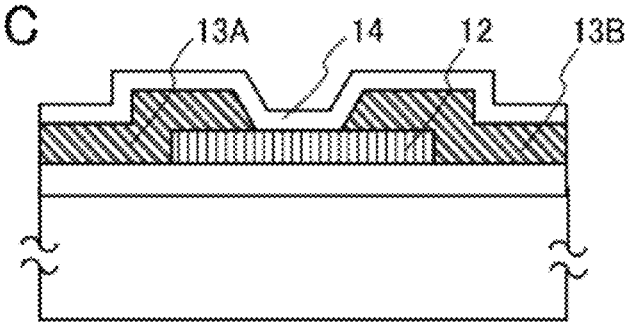
Figure 1D:
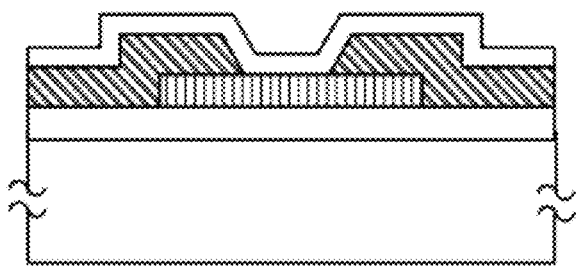
Figure 2:
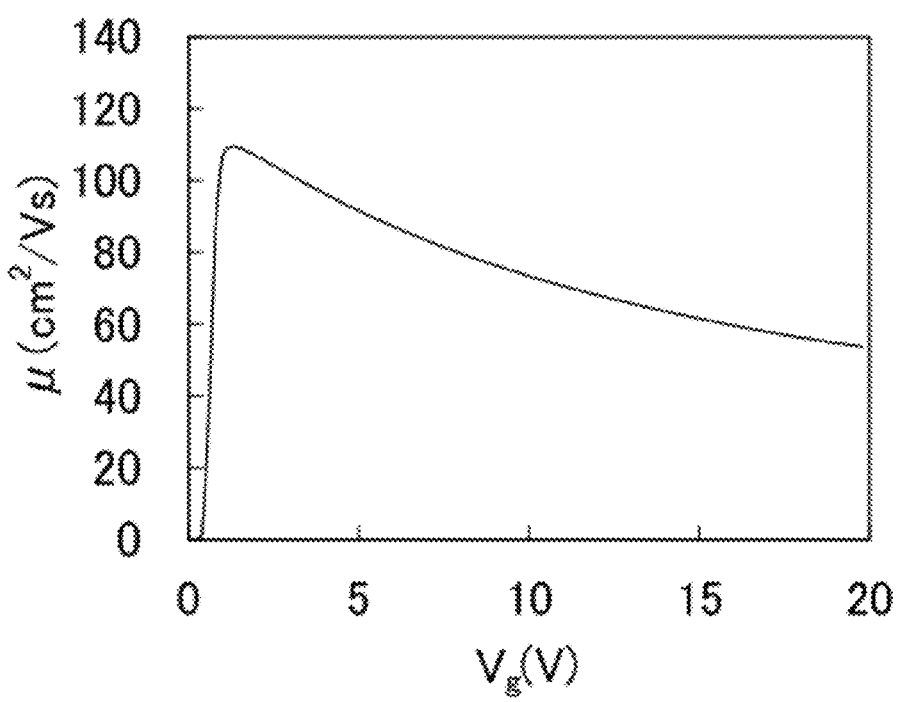
FIG. 2 is a graph showing gate voltage dependence of mobility obtained by calculation.
Figure 3A:
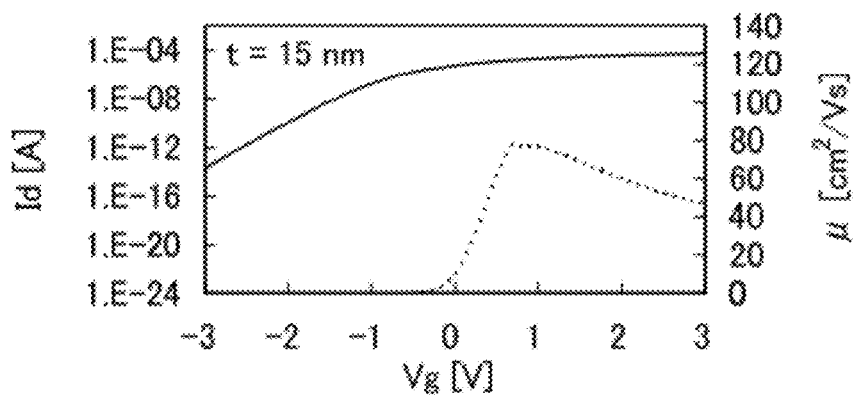
FIGS. 3A to 3C are graphs each showing gate voltage dependence of drain current and mobility obtained by calculation.
Figure 3B:
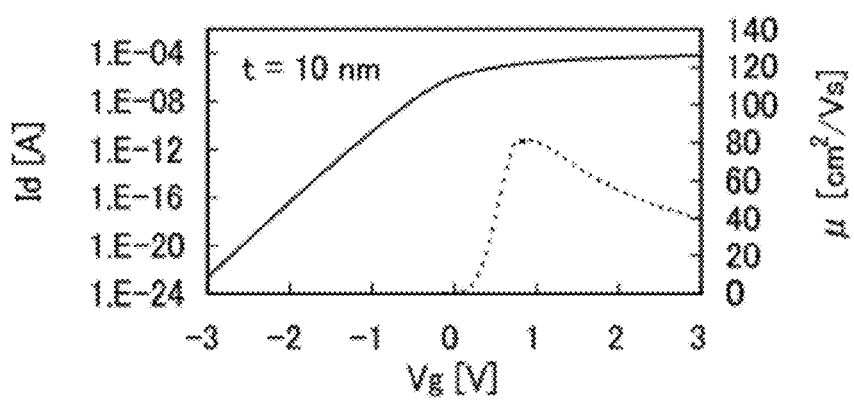
Figure 3C:
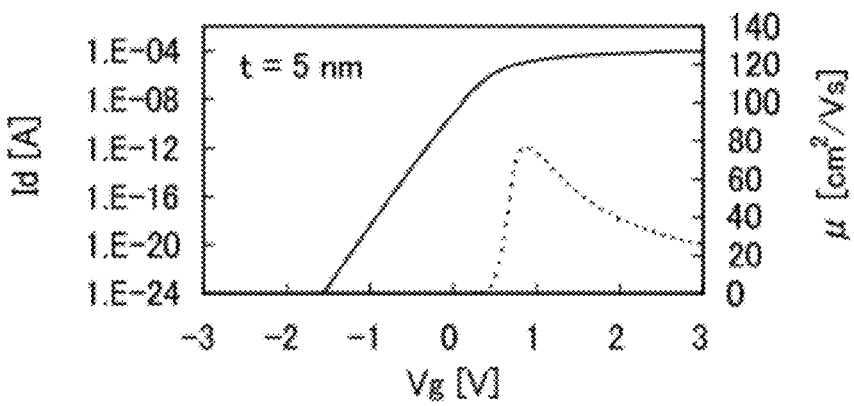
Figure 4A:
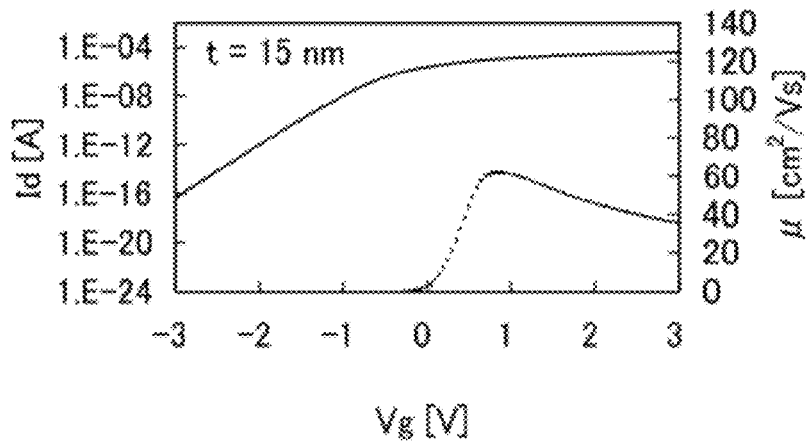
FIGS. 4A to 4C are graphs each showing gate voltage dependence of drain current and mobility obtained by calculation.
Figure 4B:
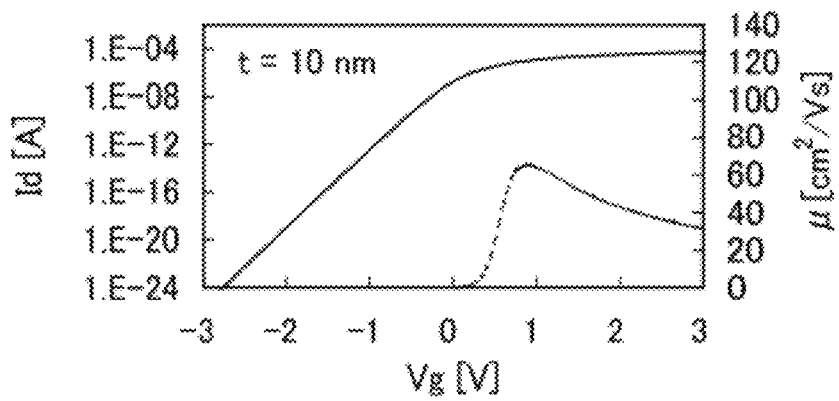
Figure 4C:
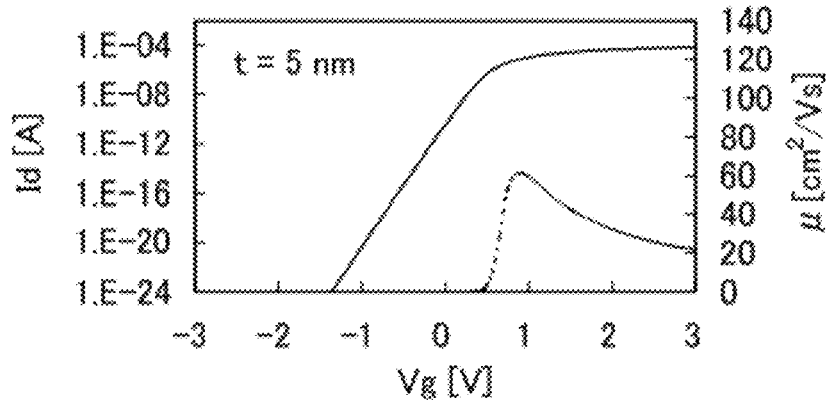
Figure 5A:
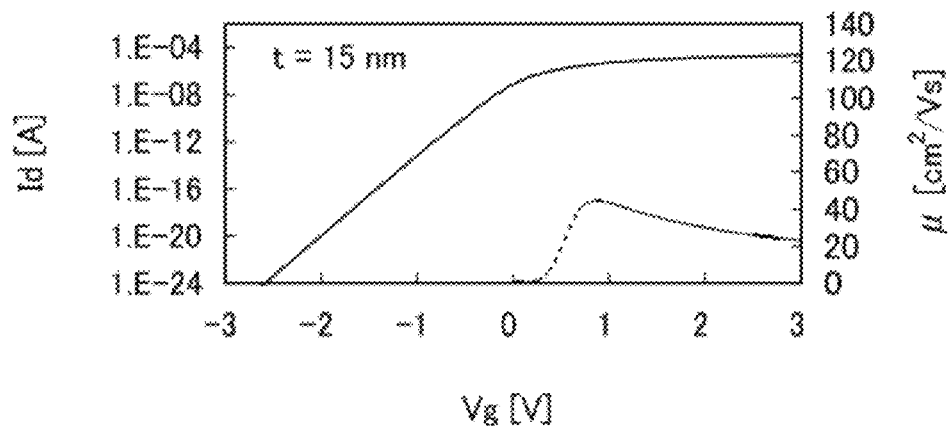
FIGS. 5A to 5C are graphs each showing gate voltage dependence of drain current and mobility obtained by calculation.
Figure 5B:
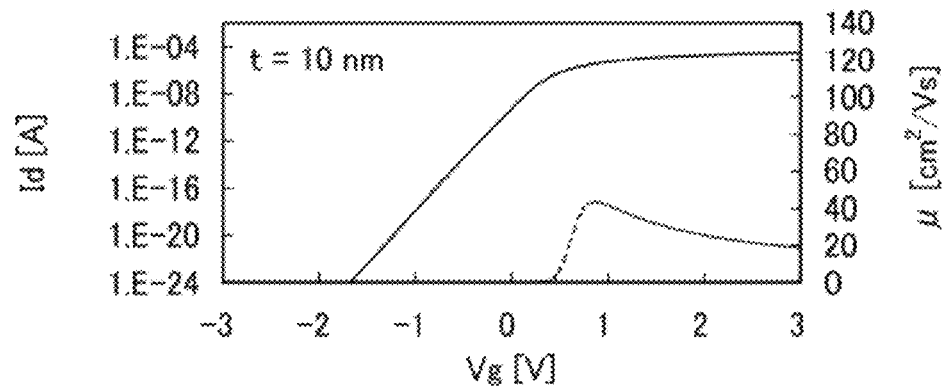
Figure 5C:
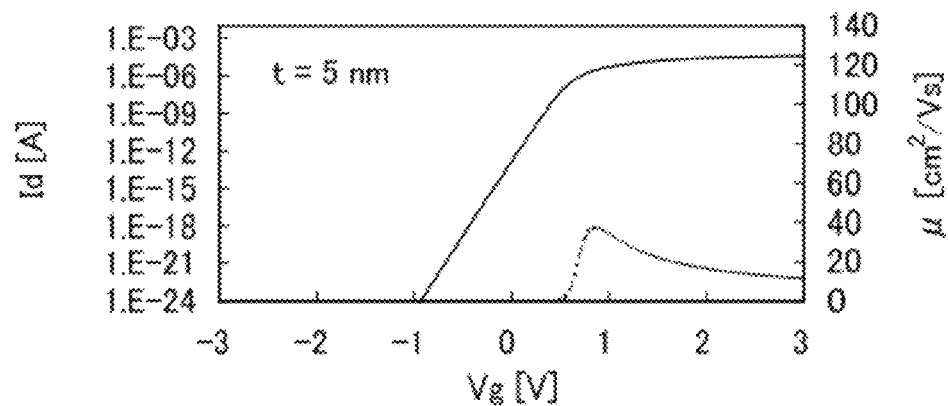

Hereinafter, embodiments will be described with reference to drawings. However, the embodiments can be implemented with different modes. It will be readily appreciated by those skilled in the art that modes and details can be changed in various ways without departing from the spirit and scope of the present invention. Therefore, the present invention is not interpreted as being limited to the description of the embodiments below. Note that in structures described below, the same portions or portions having similar functions are denoted by the same reference numerals in different drawings, and description thereof is not repeated.

Note that the size, the thickness of a layer, distortion of the waveform of a signal, and a region of each structure illustrated in the drawings and the like in the embodiments are exaggerated for simplicity in some cases. Therefore, embodiments of the present invention are not limited to such scales.

Note that terms such as "first", "second", and "third" in this specification are used in order to avoid confusion among components, and the terms do not limit the components numerically.

Embodiment 1

This embodiment describes a configuration of a display device having a signal line driver circuit including switch circuit portions.

A structural example of a display device is described with reference to FIG. 7. The display device includes a pixel portion 701, a scan line driver circuit portion 702, and a signal line driver circuit portion 703 over a substrate 700.

Note that as the substrate 700, in addition to a glass substrate and a ceramic substrate, a plastic substrate or the like with heat resistance can be used.

In the pixel portion 701, a plurality of pixels is provided for intersection portions of scan lines and signal lines. Since the video signal is supplied to respective pixels 704 through the signal lines in the pixel portion 701, an image with desired grayscale is displayed. In addition, a pixel electrode which is connected to a transistor and a display element is provided for each pixel. A gate electrode of the transistor is connected to a scan line; one of electrodes serving as a source electrode and a drain electrode (a first terminal) of the thin film transistor is connected to a signal line; and the other of the electrodes serving as the source electrode and the drain electrode (a second terminal) of the thin film transistor is connected to any other element in the pixel. Note that the display element connected to the pixel electrode may be any display element that is driven with an electric signal, e.g., a liquid crystal display element or a light emitting element.

The scan line driver circuit portion 702 outputs scan signals to a plurality of scan lines which extends to the pixel portion. In FIG. 7, although the scan line driver circuit portion 702 is provided over the substrate 700, part or all of functions of the scan line driver circuit may be provided outside the substrate 700. In addition, although not shown, signals for driving the scan line driver circuit, such as a clock signal (GCK) and a start pulse (GSP), are input to the scan line driver circuit portion 702 through an external connection terminal 705.

The signal line driver circuit portion 703 includes a plurality of switch circuit portions 706_1 to 706_N (N is a natural number). The switch circuit portions 706_1 to 706_N each include a plurality of transistors 707_1 to 707_$k$ ($k$ is a natural number). The transistors 707_1 to 707_$k$ have the same conductivity type as a transistor in the pixel 704 and a transistor in the scan line driver circuit portion 702.

Connections in the signal line driver circuit portion 703 are described taking the switch circuit portion 706_1 as an example. First terminals of the transistors 707_1 to 707_$k$ in the switch circuit portion 706_1 are connected to a wiring 708_1. Second terminals of the transistors 707_1 to 707_$k$ in the switch circuit portion 706_1 are connected to wirings $S_1$ to $S_k$, respectively. Gates of the transistors 707_1 to 707_$k$ in the switch circuit portion 706_1 are connected to wirings 709_1 to 709_$k$, respectively.

A sampling signal output circuit 709 has a function of supplying sampling signals to the switch circuit portions 706_1 to 706_N through the external connection terminal 705 via the wirings 709_1 to 709_k.

A video signal output circuit 708 has a function of outputting the video signal to the switch circuit portions 706_1 to 706_N through the external connection terminal 705. For example, the video signal output circuit 708 supplies the video signal to the switch circuit portion 706_1 through the external connection terminal 705 and the wiring 708_1. The video signal is an analog signal in many cases.

Note that in the case where the sampling signal output circuit 709 and the video signal output circuit 708 are formed outside the substrate 700, the sampling signal output circuit 709 and the video signal output circuit 708 can be mounted on an FPC (flexible printed circuit) which is connected to the external connection terminal 705 by TAB (tape automated bonding). Alternatively, the sampling signal output circuit 709 and the video signal output circuit 708 can be mounted on the substrate 700 by COG (chip on glass).

The switch circuit portions 706_1 to 706_N have a function of selecting, with the transistors 707_1 to 707_k, to which wiring the video signal from the video signal output circuit 708 is output. For example, the switch circuit portion 706_1 has a function of selecting, with sampling signals supplied via the wirings 709_1 to 709_k, to which wiring between the wirings $S_1$ to $S_k$ the video signal output from the video signal output circuit 708 via the wiring 708_1 is output.

The transistors 707_1 to 707_k in the switch circuit portion 706_1 have functions of controlling conduction or nonconduction between the wiring 708_1 and the wirings $S_1$ to $S_k$, in accordance with the sampling signals from the sampling signal output circuit 709.

Figure 7:
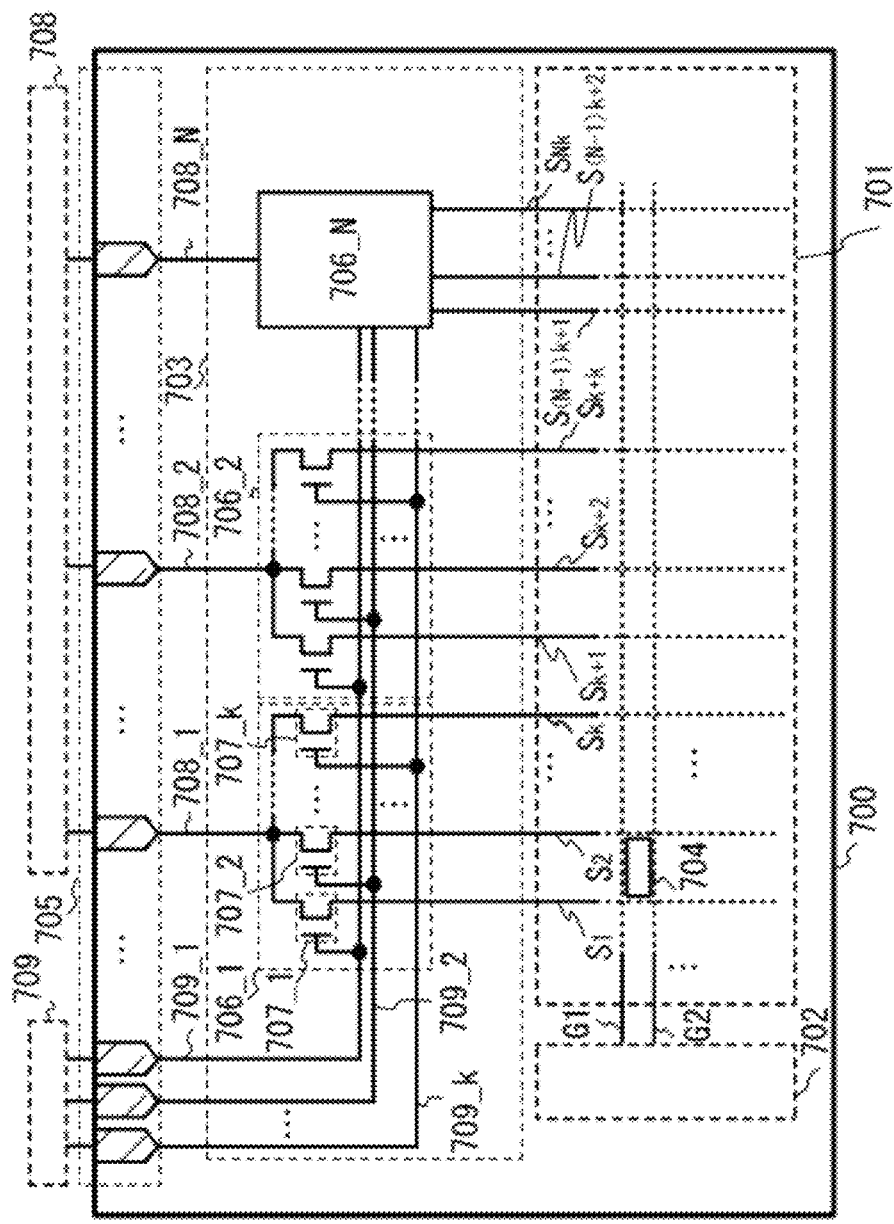
FIG. 7 illustrates one embodiment of a display device according to one embodiment of the present invention.
Figure 8:
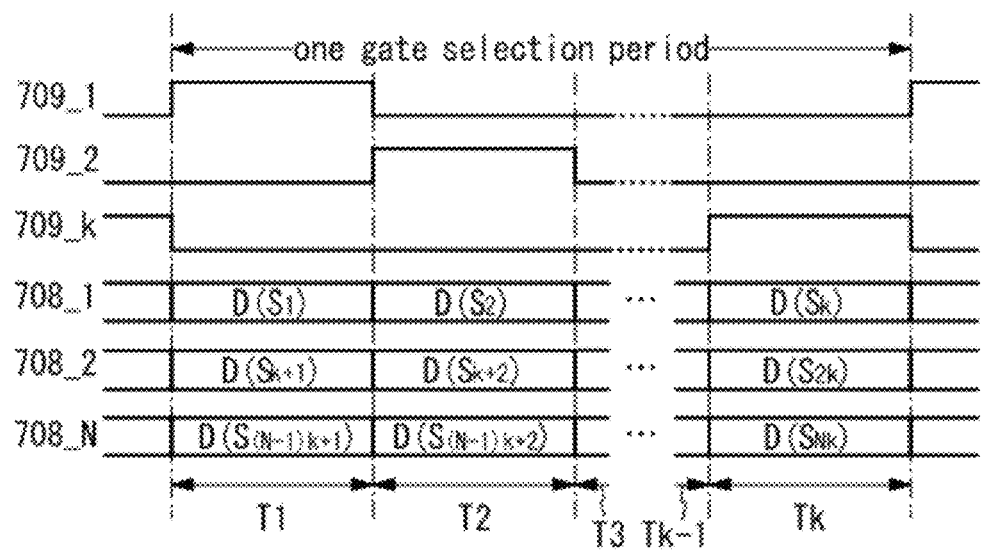
FIG. 8 is a timing chart for operation of a display device according to one embodiment of the present invention.

Next, the operation of the signal line driver circuit in FIG. 7 is described with reference to a timing chart of FIG. 8. FIG. 8 illustrates examples of sampling signals supplied via the wirings 709_1 to 709_k (in FIG. 8, 709_1, 7092, and 709_k) and signals supplied via the wirings 708_1 to 708_N (in FIG. 8, 708_1, 7082, and 708_N). Note that one operation period for the signal line driver circuit corresponds to one gate selection period for a display device. Note that one gate selection period is divided into periods T1 to Tk, for example. In the periods T1 to Tk, the pixels in a selected row are supplied with the video signal (Data (D)).

In the periods T1 to Tk, the sampling signal output circuit 709 outputs a high level signal in sequence to the wirings 709_1 to 709_k. For example, in the period T1, the sampling signal output circuit 709 outputs a high level signal to the wiring 709_1. Then, the transistors 707_1 in the switch circuit portions 706_1 to 706_N are turned on. Consequently, for example, electrical continuity between each of the wirings 708_1 to 708_N and a corresponding one of the signal lines $S_1, S_{k+1}, \ldots, S_{(N-1)k+1}$ is established. At this time, the wiring 708_1, the wiring 7082, and the wiring 708_N receive D ($S_1$), D ($S_{k+1}$), and D ($S_{(N-1)k+1}$), respectively. Thus, in the periods T1 to Tk, the pixels in a selected row are supplied (N columns of pixels at a time) with a video signal.

By supplying the video signal to a plurality of columns of pixels at a time as described above, the number of the wirings which select the video signal can be reduced. This results in a reduction in the number of connections between the display device and the sampling signal output circuit 709. Moreover, by supplying the video signal to a plurality of columns of pixels at a time, write time can be increased, which prevents insufficient supply of a write signal.

In the case where the transistors 707_1 to 707_k in the switch circuit portions 706_1 to 706_N include an In—Ga—Zn-based oxide film that is a film of an oxide semiconductor not highly purified, assumed conditions for these transistors are as follows. The case of the transistor 707_1 is described as an example.

On resistance Ron can be represented by Formula 6 assuming that the transistor 707_1 has a 300-nm-thick gate insulating layer, a dielectric constant of 3.8, a gate-source voltage Vgs of 5 V, a threshold voltage Vth of 2 V, a field-effect mobility μ of 10 cm²/Vs, and a gate length L of 3 μm.

$$Ron = Vds/Id \qquad \text{[Formula 6]}$$

Drain current Id in Formula 6 is represented by Formula 7.

$$Id = \mu \cdot Co \cdot W/L \cdot (Vgs - Vth) \cdot Vds \qquad \text{[Formula 7]}$$

Co is an electrostatic capacitance per unit area of the gate insulating layer, W is a gate width, L is a gate length, and Vds is a voltage between the drain and the source.

Formula 6 and Formula 7 indicate that W needs to be 9 cm in order that the on resistance can be 110Ω or less. However, although the display device is required to have a small frame size, the transistors in the switch circuit portions occupy a very large area if W is 9 cm. In other words, the display device has a very large frame size when using an In—Ga—Zn-based oxide film that is a film of an oxide semiconductor not highly purified and that results in a field-effect mobility μ of 10 cm²/Vs. Use of amorphous silicon leads to a lower mobility than use of such an oxide semiconductor and therefore results in a larger frame size than use of such an oxide semiconductor.

In contrast, an In—Sn—Zn-based oxide film that is a highly-purified oxide semiconductor film can lead to a field-effect mobility μ of 80 cm²/Vs or more or 120 cm²/Vs or more. In this case, under the above-described conditions, W can be reduced to 11.3 mm or 7.5 mm, thereby reducing the area of the transistors in the switch circuit portions. Consequently, the frame size of the display device can be reduced.

Thus, use of a highly-purified oxide semiconductor film as active layers of the transistors in the switch circuit portions results in a reduction in frame size and allows these transistors to be formed over the same insulating substrate as circuits such as pixels. Moreover, use of a highly-purified oxide semiconductor film as active layers of the transistors in the switch circuit portions prevents variations between the transistors in characteristics such as threshold voltage and enables adequate charging and discharging of the signal lines.

As described above, a transistor having a highly-purified oxide semiconductor in a channel formation region may be used as the transistors in the switch circuit portions in the signal line driver circuit in this embodiment. A transistor having a highly-purified oxide semiconductor in a channel formation region has a high field-effect mobility. Thus, use of this transistor reduces the size of the transistors in the switch circuit portions in the signal line driver circuit and enables adequate charging and discharging of the signal lines.

This embodiment can be implemented in appropriate combination with any of the structures described in the other embodiments.

Embodiment 2

This embodiment describes an example of a method for manufacturing the transistors in the switch circuit portions described in Embodiment 1 with reference to FIGS. 11A to 11D and FIGS. 12A to 12D. FIGS. 13A and 13B and FIGS. 14A and 14B are examples of top views and cross-sectional views (taken along lines in the top views) of a transistor in each pixel in the pixel portion that can be formed over the same substrate as the transistors in the switch circuit portions.

This embodiment describes an example of a method for manufacturing a transistor with a bottom-gate structure, but the transistors in the switch circuit portions and the transistors in the pixels may have a top-gate structure. In addition, this embodiment describes an example of a method for manufacturing a staggered transistor, but a coplanar transistor can also be manufactured.

This embodiment describes an example of a method for manufacturing the transistors in the switch circuit portions, but the transistors in the signal line driver circuit and/or the scan line driver circuit can also be manufactured by this method.

A description is given of an example of a method for manufacturing a transistor with a channel-etch and bottom-gate structure with reference to FIGS. 11A to 11D.

First, a conductive film is formed over a substrate 400 which is a substrate having an insulating surface, and then, a gate electrode layer 401 is provided using a photolithography process with the use of a photomask.

As the substrate 400, a glass substrate which enables mass production is preferably used. As a glass substrate used for the substrate 400, a glass substrate whose strain point is higher than or equal to 730° C. may be used when the temperature of heat treatment to be performed in a later step is high. For the substrate 400, for example, a glass material such as aluminosilicate glass, aluminoborosilicate glass, or barium borosilicate glass is used.

An insulating layer serving as a base layer may be provided between the substrate 400 and the gate electrode layer 401. The base layer has a function of preventing diffusion of an impurity element from the substrate 400, and can be formed with a single-layer or stacked-layer structure using one or more of silicon nitride, silicon oxide, silicon nitride oxide, and silicon oxynitride.

Silicon oxynitride refers to a substance that contains a larger amount of oxygen than that of nitrogen. For example, silicon oxynitride contains oxygen, nitrogen, silicon, and hydrogen at concentrations of higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. In addition, silicon nitride oxide refers to a substance that contains a larger amount of nitrogen than that of oxygen. For example, silicon nitride oxide contains oxygen, nitrogen, silicon, and hydrogen at concentrations of higher than or equal to 5 at. % and lower than or equal to 30 at. %, higher than or equal to 20 at. % and lower than or equal to 55 at. %, higher than or equal 25 at. % and lower than or equal to 35 at. %, and higher than or equal to 10 at. % and lower than or equal to 25 at. %, respectively. Note that the above ranges are obtained in the case where measurement is performed using Rutherford backscattering spectrometry (RBS) and hydrogen forward scattering spectrometry (HFS). Moreover, the total of the percentages of the constituent elements does not exceed 100 at. %.

The gate electrode layer 401 may be formed to have a single-layer or stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements. Alternatively, an oxide or an oxynitride which contains at least In and Zn may be used. For example, an In—Ga—Zn—O—N-based oxide or the like can be used.

Next, a gate insulating layer 402 is formed over the gate electrode layer 401. The gate insulating layer 402 is formed by a sputtering method, an evaporation method, a plasma-enhanced chemical vapor deposition (PCVD) method, a pulsed laser deposition (PLD) method, an atomic layer deposition (ALD) method, a molecular beam epitaxy (MBE) method, or the like without exposure to the air after the gate electrode layer 401 is formed.

It is preferable that an insulating film from which oxygen is released by heat treatment be used as the gate insulating layer 402.

To release oxygen by heat treatment means that the released amount of oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

Here, a method in which the amount of released oxygen is measured by conversion into oxygen atoms using TDS analysis will be described.

The amount of released gas in TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the amount of the released oxygen molecules ($N_{O2}$) from an insulating film can be obtained according to Formula 8 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = \frac{N_{H2}}{S_{H2}} \times S_{O2} \times \alpha \quad \text{[Formula 8]}$$

In Formula 8, $N_{H2}$ is the value obtained by conversion of the amount of hydrogen molecules released from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the Formula 8. Note that the amount of released oxygen from the above insulating film is measured with a thermal desorption spectroscopy apparatus produced by ESCO Ltd., EMD-WA1000S/W, using a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen when converted into oxygen atoms is twice the amount of the released oxygen molecules.

In the above structure, the film from which oxygen is released by heat treatment may be oxygen-excess silicon oxide ($SiO_X$(X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

Oxygen is supplied from the gate insulating layer 402 to an oxide semiconductor film in contact with the gate insulating layer 402, whereby interface states between the oxide semiconductor film and the gate insulating layer 402 which are in contact with each other can be reduced. As a result, carrier trapping, occurring due to an operation of the transistor or the like, at the interface between the oxide semiconductor film and the gate insulating layer 402 which are in contact with each other can be suppressed, and thus, a transistor with less deterioration in electric characteristics can be obtained.

Further, in some cases, electric charge is generated owing to an oxygen vacancy in the oxide semiconductor film in contact with the gate insulating layer. In general, part of oxygen vacancies in an oxide semiconductor film serves as a donor and causes release of an electron which is a carrier. As a result, the threshold voltage of a transistor shifts in the negative direction. In view of this, when oxygen is sufficiently supplied from the gate insulating layer 402 to the oxide semiconductor film provided in contact with the gate insulating layer 402 and the oxide semiconductor film provided in contact with the gate insulating layer 402 preferably contains excess oxygen, oxygen vacancies in the oxide semiconductor film which cause the negative shift of the threshold voltage can be reduced.

For easier crystal growth in the oxide semiconductor film in contact with the gate insulating layer 402, it is preferable that the gate insulating layer 402 be sufficiently flat.

The gate insulating layer 402 may be formed to have a single-layer or stacked-layer structure, using one or more of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

The gate insulating layer 402 is formed preferably by a sputtering method in an oxygen gas atmosphere at a substrate heating temperature of higher than or equal to room temperature and lower than or equal to 200° C., preferably higher than or equal to 50° C. and lower than or equal to 150° C. Note that an oxygen gas to which a rare gas is added may be used. In that case, the percentage of the oxygen gas is higher than or equal to 30 vol. %, preferably higher than or equal to 50 vol. %, more preferably higher than or equal to 80 vol. %. The thickness of the gate insulating layer 402 is greater than or equal to 100 nm and less than or equal to 1000 nm, preferably greater than or equal to 200 nm and less than or equal to 700 nm. Lower substrate heating temperature at the time of film formation, higher percentage of an oxygen gas in a film formation atmosphere, or a larger thickness of the gate insulating layer 402 leads to a larger amount of oxygen that is released at the time of performing heat treatment on the gate insulating layer 402. The concentration of hydrogen in the film can be more reduced by a sputtering method than a PCVD method. Note that the thickness of the gate insulating layer 402 is set such that the productivity is not reduced, although can be greater than 1000 nm.

Then, an oxide semiconductor film 403 is formed by a sputtering method, an evaporation method, a PCVD method, a PLD method, an ALD method, an MBE method, or the like over the gate insulating layer 402. The above steps correspond to the cross-sectional view illustrated in FIG. 11A.

The thickness of the oxide semiconductor film 403 is greater than or equal to 1 nm and less than or equal to 40 nm, preferably greater than or equal to 3 nm and less than or equal to 20 nm. In particular, in the case where the transistor has a channel length of less than or equal to 30 nm and the oxide semiconductor film 403 has a thickness of around 5 nm, a short channel effect can be suppressed and stable electric characteristics can be obtained.

In particular, when the oxide semiconductor film 403 is formed using an In—Sn—Zn-based oxide material, a transistor having high field-effect mobility can be obtained.

As for the oxide semiconductor film 403, a material which has a band gap of greater than or equal to 2.5 eV, preferably greater than or equal to 2.8 eV, more preferably greater than or equal to 3.0 eV is selected in order to reduce the off-state current of the transistor. With the use of the oxide semiconductor film 403 with a band gap in the above range, the off-state current of the transistor can be reduced.

In the oxide semiconductor film 403, preferably, hydrogen, an alkali metal, an alkaline earth metal, and the like are reduced and the concentration of impurities is very low. When the oxide semiconductor film 403 contains any of the above impurities, recombination in a band gap occurs owing to a level formed by the impurity, so that the transistor has increased off-state current.

Specifically, the concentration of hydrogen in the oxide semiconductor film 403, which is measured by secondary ion mass spectrometry (SIMS), is lower than $5\times10^{19}$ cm$^{-3}$, preferably lower than or equal to $5\times10^{18}$ cm$^{-3}$, more preferably lower than or equal to $1\times10^{18}$ cm$^{-3}$, still more preferably lower than or equal to $5\times10^{17}$ cm$^{-3}$.

Further, as for alkali metal concentration in the oxide semiconductor film 403, which is measured by SIMS, the concentration of sodium is lower than or equal to $5\times10^{16}$ cm$^{-3}$, preferably lower than or equal to $1\times10^{16}$ cm$^{-3}$, more preferably lower than or equal to $1\times10^{15}$ cm$^{-3}$. The concentration of lithium is lower than or equal to $5\times10^{15}$ cm$^{-3}$, preferably lower than or equal to $1\times10^{15}$ cm$^{-3}$. The concentration of potassium is lower than or equal to $5\times10^{15}$ cm$^{-3}$, preferably lower than or equal to $1\times10^{15}$ cm$^{-3}$.

The oxide semiconductor film 403 is preferably formed by a sputtering method in an oxygen gas atmosphere at a substrate heating temperature of higher than or equal to 100° C. and lower than or equal to 600° C., preferably higher than or equal to 150° C. and lower than or equal to 550° C., more preferably higher than or equal to 200° C. and lower than or equal to 500° C. The thickness of the oxide semiconductor film 403 is greater than or equal to 1 nm and less than or equal to 40 nm, preferably greater than or equal to 3 nm and less than or equal to 20 nm. As the substrate heating temperature at the time of film formation is higher, the impurity concentration in the obtained oxide semiconductor film 403 is lower. In addition, an atomic arrangement in the oxide semiconductor film 403 is ordered, and the density thereof is increased, so that a polycrystalline oxide semiconductor film or a CAAC-OS film can easily be formed. Furthermore, when an oxygen gas atmosphere is employed for the deposition, an unnecessary atom such as a rare gas atom is not contained in the oxide semiconductor film 403, so that a polycrystalline oxide semiconductor film or a CAAC-OS film is likely to be formed. A mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. As the oxide semiconductor film 403 is thinner, the short-channel effect of the transistor can be reduced. However, when the oxide semiconductor film 403 is too thin, the oxide semiconductor film 403 is significantly influenced by interface scattering; thus, the field-effect mobility might be decreased.

In the case of forming a film of an In—Sn—Zn-based oxide as the oxide semiconductor film 403 by a sputtering method, it is preferable to use an In—Sn—Zn—O target having an atomic ratio of In:Sn:Zn=2:1:3, 1:2:2, 1:1:1, or 20:45:35. When the oxide semiconductor film 403 is formed using an In—Sn—Zn—O target having the aforementioned composition ratio, a polycrystalline oxide semiconductor film or CAAC-OS film is easily formed.

Next, first heat treatment is performed. The first heat treatment is performed in a reduced pressure atmosphere, an inert atmosphere, or an oxidizing atmosphere. By the first heat treatment, the impurity concentration in the oxide semiconductor film 403 can be reduced. The above steps correspond to the cross-sectional view illustrated in FIG. 11B.

The first heat treatment is preferably performed in such a manner that heat treatment in a reduced pressure atmosphere or an inert gas atmosphere is completed and then, the atmosphere is changed to an oxidizing atmosphere while the temperature is kept, and heat treatment is further performed. When the heat treatment is performed in a reduced pressure atmosphere or an inert atmosphere, the impurity concentration in the oxide semiconductor film 403 can be effectively reduced; however, oxygen vacancies are caused at the same time. By the heat treatment in the oxidizing atmosphere, the caused oxygen vacancies can be reduced.

By performing the first heat treatment on the oxide semiconductor film 403 in addition to the substrate heating in deposition, the impurity levels in the film can be significantly reduced. Accordingly, the field-effect mobility of the transistor can be increased so as to be close to ideal field-effect mobility to be described later.

The oxide semiconductor film 403 may be crystallized in the following manner: oxygen ions are implanted into the oxide semiconductor film 403, impurities such as hydrogen included in the oxide semiconductor film 403 are released by heat treatment, and the oxide semiconductor film 403 is crystallized through the heat treatment or by another heat treatment performed later.

Further, the oxide semiconductor film 403 may be selectively crystallized not by the first heat treatment but by irradiation with a laser beam. Alternatively, it is also possible that the oxide semiconductor film 403 is selectively crystallized by irradiation with a laser beam while the first heat treatment is performed. Laser beam irradiation is performed in an inert atmosphere, an oxidizing atmosphere, or a reduced-pressure atmosphere. When laser beam irradiation is performed, a continuous wave (CW) laser beam or a pulsed laser beam can be used. For example, it is possible to use a gas laser beam such as an Ar laser beam, a Kr laser beam, or an excimer laser beam; a laser beam using, as a medium, single crystal or polycrystalline YAG, YVO$_4$, forsterite (Mg$_2$SiO$_4$), YAlO$_3$, or GdVO$_4$ doped with one or more of Nd, Yb, Cr, Ti, Ho, Er, Tm, and Ta as a dopant; a solid-state laser beam such as a glass laser beam, a ruby laser beam, an alexandrite laser beam, or a Ti:sapphire laser beam; or a vapor laser beam emitted using one or both of a copper vapor laser and a gold vapor laser. By irradiation with the fundamental harmonic of such a laser beam or any of the second harmonic to the fifth harmonic of the fundamental harmonic of the laser beam, the oxide semiconductor film 403 can be crystallized. Note that it is preferable to use a laser beam having larger energy than a band gap of the oxide semiconductor film 403. For example, a laser beam emitted from a KrF, ArF, XeCl, or XeF excimer laser may be used. Note that the shape of the laser beam may be linear.

Note that laser beam irradiation may be performed plural times under different conditions. For example, it is preferable that first laser beam irradiation is performed in a rare gas atmosphere or a reduced-pressure atmosphere, and second laser beam irradiation is performed in an oxidizing atmosphere because in that case, high crystallinity can be obtained while oxygen vacancies in the oxide semiconductor film 403 are reduced.

Then, the oxide semiconductor film 403 is processed into an island shape by a photolithography process or the like, so that an oxide semiconductor film 404 is formed.

Then, after a conductive film is formed over the gate insulating layer 402 and the oxide semiconductor film 404, a source electrode 405A and a drain electrode 405B are formed through a photolithography process or the like. The conductive film may be formed by a sputtering method, an evaporation method, a PCVD method, a PLD method, an ALD method, an MBE method, or the like. The source electrode 405A and the drain electrode 405B may be formed as in the case of the gate electrode layer 401 to have a single-layer structure or a stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements.

Then, an insulating film 406 to be an upper insulating film is formed by a sputtering method, an evaporation method, a PCVD method, a PLD method, an ALD method, an MBE method, or the like. The above steps correspond to the cross-sectional view illustrated in FIG. 11C. The insulating film 406 may be formed by a method similar to that of the gate insulating layer 402.

A protective insulating film may be formed to be stacked over the insulating film 406 (not illustrated). It is preferable that the protective insulating film be a film through which oxygen does not pass even when heat treatment at a temperature of higher than or equal to 250° C. and lower than or equal to 450° C., preferably higher than or equal to 150° C. and lower than or equal to 800° C. is performed for one hour, for example.

In the case where the protective insulating film with such a property is provided in the periphery of the insulating film 406, oxygen released from the insulating film 406 by heat treatment can be inhibited from diffusing toward the outside of the transistor. Since oxygen is held in the insulating film 406 in this manner, the field-effect mobility of the transistor can be prevented from decreasing, variation in the threshold voltage can be reduced, and the reliability can be improved.

The protective insulating film may be formed to have a single-layer structure or a stacked-layer structure including at least one of silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

After the insulating film 406 is formed, second heat treatment is performed. The above steps correspond to the cross-sectional view illustrated in FIG. 11D. The second heat treatment is performed at a temperature of higher than or equal to 150° C. and lower than or equal to 550° C., preferably higher than or equal to 250° C. and lower than or equal to 400° C. in a reduced pressure atmosphere, an inert atmosphere, or an oxidation atmosphere. By the second heat treatment, oxygen is released from the gate insulating layer 402 and the insulating film 406, so that oxygen vacancies in the oxide semiconductor film 404 can be reduced. In addition, interface states between the gate insulating layer 402 and the oxide semiconductor film 404 and interface states between the oxide semiconductor film 404 and the insulating film 406 can be reduced, so that variation in threshold voltage of the transistor can be reduced, and the reliability thereof can be improved.

Figure 11A:
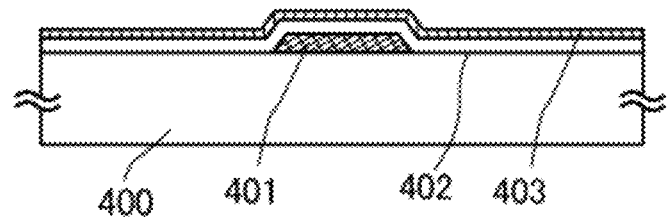
FIGS. 11A to 11D are cross-sectional views illustrating a method for manufacturing a transistor according to one embodiment of the present invention.
Figure 11B:
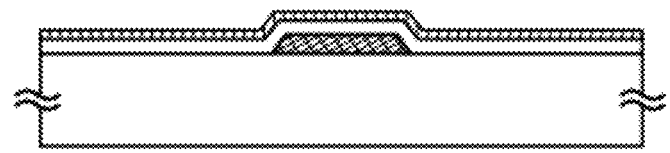
Figure 11C:
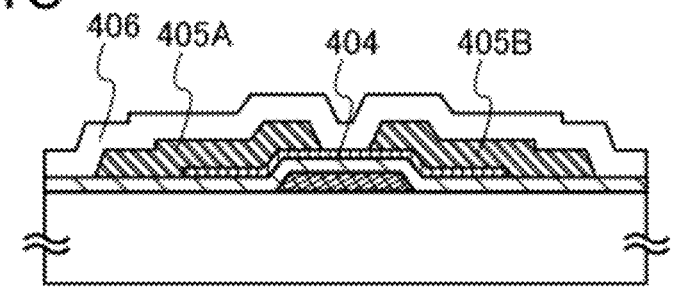
Figure 11D:
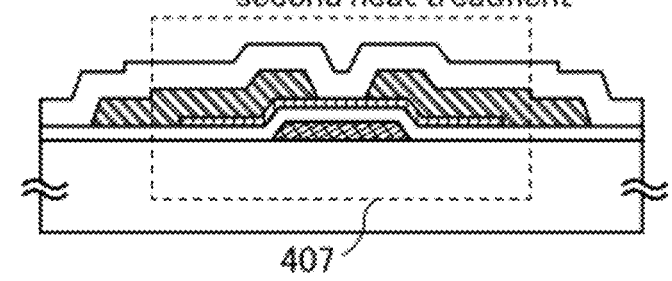

Although the transistor illustrated in FIG. 11D has a bottom gate structure, it has a structure equivalent to the structures of the transistors illustrated in FIGS. 6A and 6B. That is, the semiconductor region 103b overlapping with the gate 105 in FIGS. 6A and 6B corresponds to the oxide semiconductor film 404 in FIG. 11D. In addition, the semiconductor region 103a and the semiconductor region 103c having $n^+$-type conductivity in FIGS. 6A and 6B corresponds to a contact region of the source electrode 405A and the oxide semiconductor film 404 and a contact region of the drain electrode 405B and the oxide semiconductor film 404 in FIG. 11D. Thus, when interface states between the gate insulating layer 402 and the oxide semiconductor film 404 and interface states between the oxide semiconductor film 404 and the insulating film 406 are reduced, high field-effect mobility as in the result of the calculation can be obtained.

The transistor including the oxide semiconductor film 404 subjected to the first heat treatment and the second heat treatment has high field-effect mobility and a small off-state current. Specifically, the field-effect mobility of the transistor can be higher than or equal to 80 cm$^2$/Vs, preferably higher than or equal to 120 cm$^2$/Vs, and the off-state current per micrometer of the channel width can be lower than or equal to $1\times10^{-18}$ A, lower than or equal to $1\times10^{-21}$ A, or lower than or equal to $1\times10^{-24}$ A.

The oxide semiconductor film 404 is preferably non-single-crystal. If operation of the transistor or light or heat from the outside causes oxygen vacancies in the oxide semiconductor film 404 which is completely single crystal, a carrier due to the oxygen vacancy is generated in the oxide semiconductor film 404 owing to the absence of oxygen between lattices which compensate the oxygen vacancy; as a result, the threshold voltage of the transistor shifts in the negative direction in some cases.

The oxide semiconductor film 404 preferably has crystallinity. For example, a polycrystalline oxide semiconductor or a CAAC-OS in the oxide semiconductor film 403 is used.

Through the above-described steps, the transistor 407 illustrated in FIG. 11D can be manufactured.

As another structural example, an example in which a channel-stop bottom gate transistor is manufactured is described with reference to FIGS. 12A to 12D.

The transistor illustrated in FIGS. 12A to 12D is different from the transistor in FIGS. 11A to 11D in that it includes an insulating film 408 serving as a channel-stop film. In the description of FIGS. 12A to 12D, description of part in common to FIGS. 11A to 11D is omitted and for the common part, the description of FIGS. 11A to 11D may be referred to.

Figure 12A:
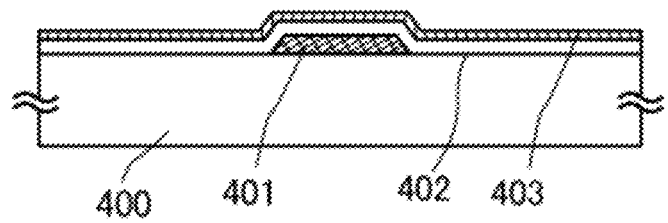
FIGS. 12A to 12D are cross-sectional views illustrating a method for manufacturing a transistor according to one embodiment of the present invention.
Figure 12B:
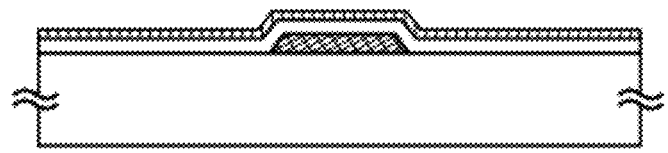
Figure 12C:
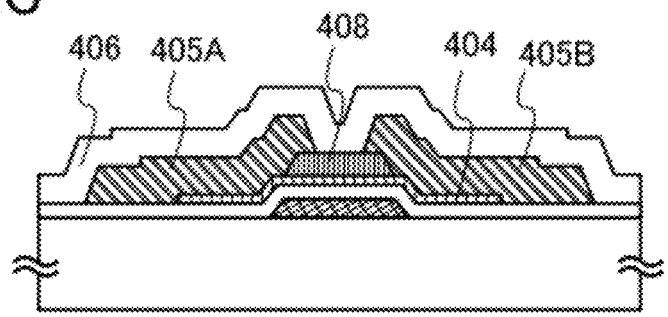

Description about FIGS. 12A and 12B is similar to that about FIGS. 11A and 11B. The insulating film 408 illustrated in FIG. 12C can be formed in a manner similar to that of the gate insulating layer 402 and the insulating film 406. That is, the insulating film 408 is preferably formed using an insulating film from which oxygen is released by heat treatment.

By providing the insulating film 408 serving as a channel-stop film, the oxide semiconductor film 404 can be prevented from being etched when the source electrode 405A and the drain electrode 405B are formed by a photolithography process or the like.

Figure 12D:
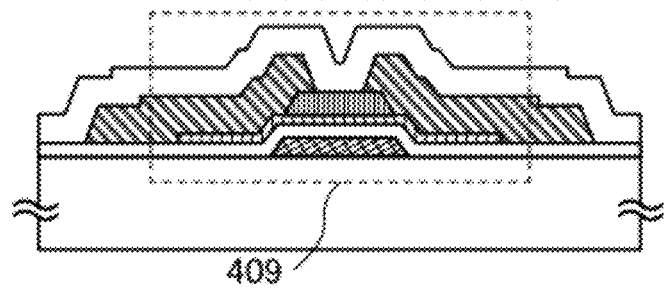

Like the insulating film 406, oxygen is released from the insulating film 408 by the second heat treatment which is performed after the insulating film 406 illustrated in FIG. 12D is formed. Therefore, an effect of reducing oxygen vacancies in the oxide semiconductor film 404 can be improved. In addition, interface states between the gate insulating layer 402 and the oxide semiconductor film 404 and interface states between the oxide semiconductor film 404 and the insulating film 408 can be reduced, so that variation in threshold voltage of the transistor can be reduced, and the reliability thereof can be improved.

Through the above-described steps, a transistor 409 illustrated in FIG. 12D can be manufactured.

Figure 13A:
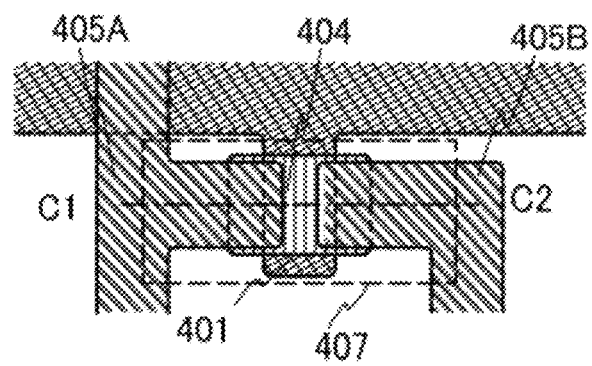
FIGS. 13A and 13B are a top view and a cross-sectional view of a transistor according to one embodiment of the present invention.
Figure 13B:
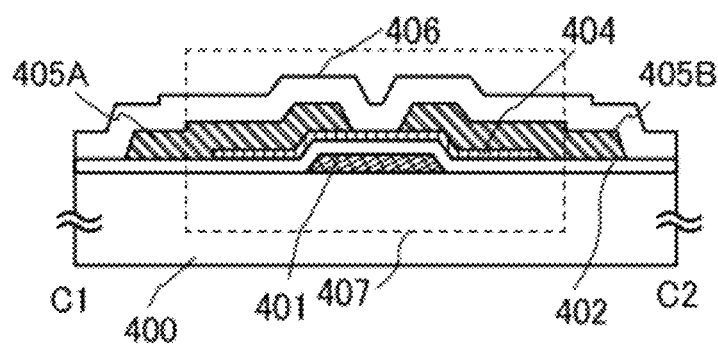

FIG. 13A is a top view of the case where a channel-etched bottom gate transistor is applied to a transistor of a pixel. FIG. 13B is a cross-sectional view taken along chain line C1-C2 in the top view of FIG. 13A.

The cross-sectional view of FIG. 13B can be described as in the case of the channel-etched bottom gate transistor illustrated in FIGS. 11A to 11D. The top view of the transistor of the pixel illustrated in FIG. 13A can also be similarly described. For example, in a pixel portion, a signal line corresponds to the source electrode 405A and a scan line corresponds to the gate electrode layer 401, and a channel formation region corresponds to the oxide semiconductor film 404. An electrode extending from the transistor to another element corresponds to the drain electrode 405B.

As described above, the channel-etched bottom gate transistor 407 can be applied to the transistor of the pixel.

Figure 14A:
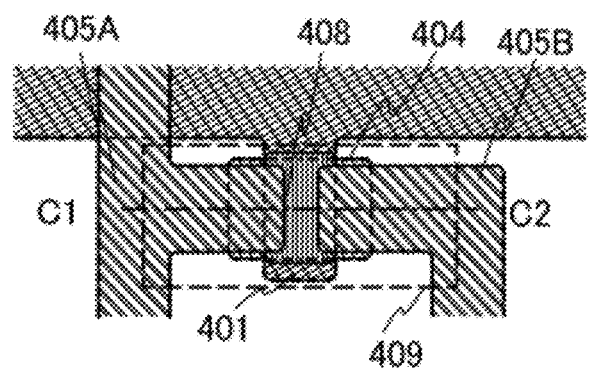
FIGS. 14A and 14B are a top view and a cross-sectional view of a transistor according to one embodiment of the present invention.
Figure 14B:
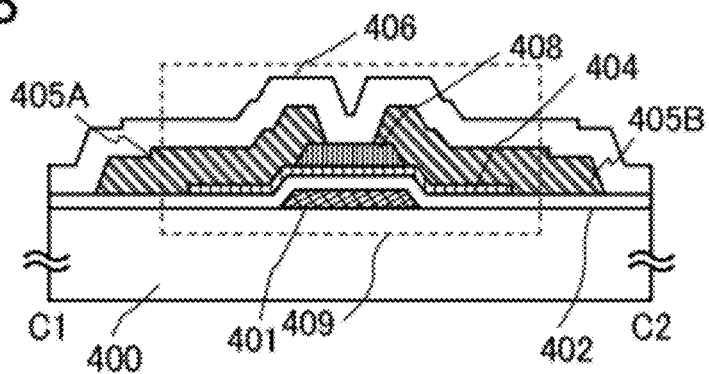

FIG. 14A is a top view of the case where a channel-stop bottom gate transistor is applied to a transistor of a pixel. FIG. 14B is a cross-sectional view taken along chain line C1-C2 in the top view of FIG. 14A.

The cross-sectional view of FIG. 14B is described as in the case of the channel-stop bottom gate transistor illustrated in FIGS. 12A to 12D. The top view of the transistor of the pixel illustrated in FIG. 14A can also be similarly described. For example, in a pixel portion, a signal line corresponds to the source electrode 405A and a scan line corresponds to the gate electrode layer 401, and a channel formation region corresponds to the oxide semiconductor film 404. An electrode extending from the transistor to another element corresponds to the drain electrode 405B, and a channel-stop film corresponds to the insulating film 408.

As described above, the channel-stop bottom gate transistor 409 can be applied to the transistor of the pixel.

According to this embodiment, it is possible to provide a highly reliable transistor having high field-effect mobility and extremely small off-state current which includes an oxide semiconductor and in which variation in threshold voltage is small.

Embodiment 3

In this embodiment, a c-axis aligned crystalline oxide semiconductor (CAAC-OS) film will be described.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, atoms are arranged in a triangular or hexagonal pattern when seen from a direction perpendicular to an a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, change in electric characteristics of the transistor due to irradiation with visible light or ultraviolet light can be reduced. Thus, the transistor has high reliability.

The CAAC-OS film will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoordinate O and O surrounded by a double circle represents tricoordinate O.

Figure 15A:
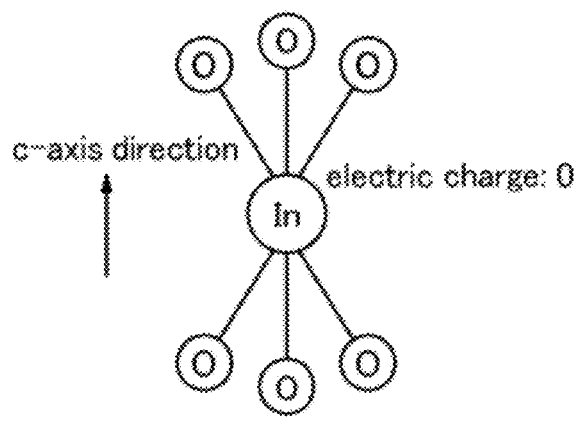
FIGS. 15A to 15E are diagrams each illustrating a crystal structure of an oxide material.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
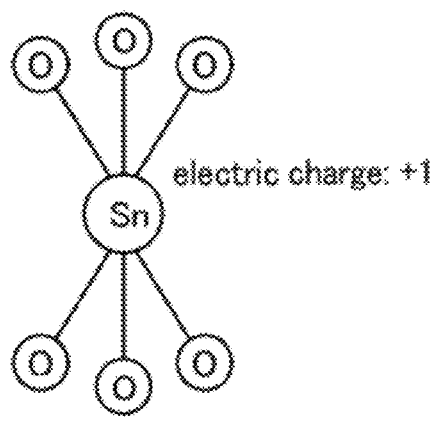
Figure 15B:
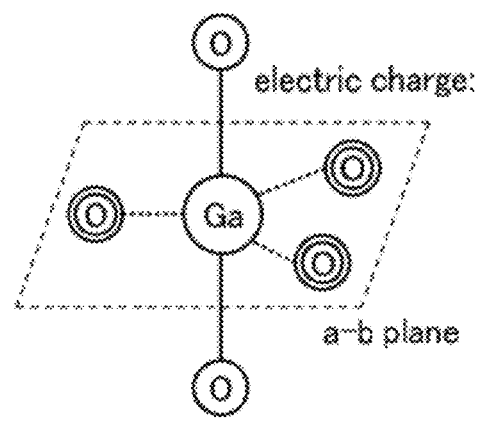

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
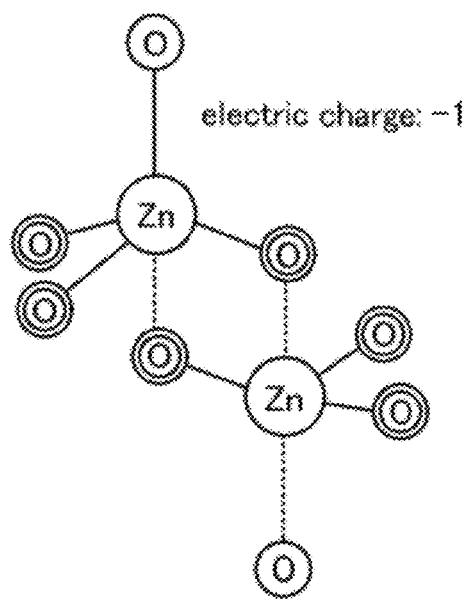
Figure 15C:
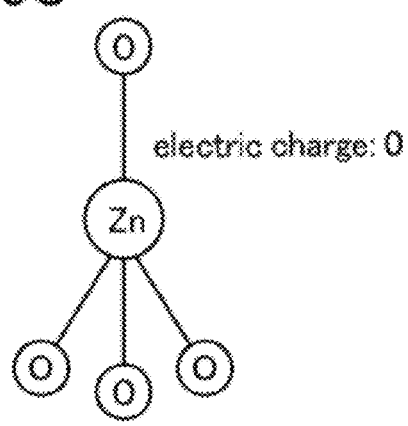

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom in FIG. 15B has one proximate Ga atom in the downward direction, and the one O atom in the lower half has one proximate Ga atom in the upward direction. The one O atom in the upper half with respect to the tetracoordinate Zn atom in FIG. 15C has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason will be described hereinafter. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 16A:
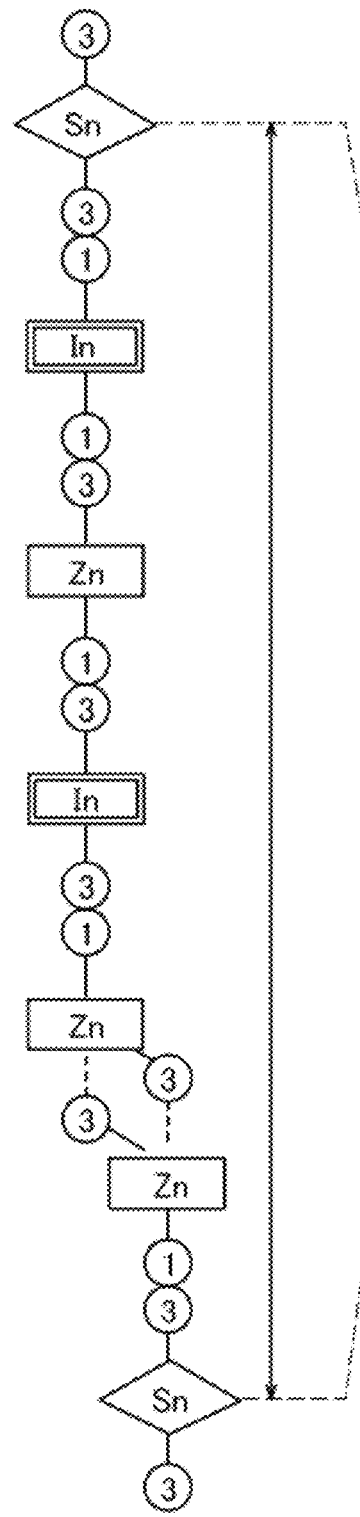
FIGS. 16A to 16C are diagrams illustrating a crystal structure of an oxide material.
Figure 16B:
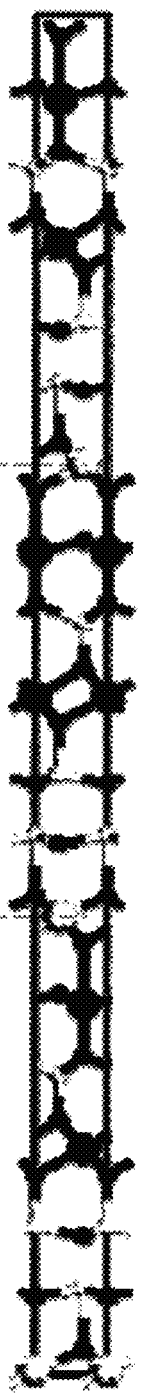
Figure 16C:

FIG. 16A illustrates a model of a medium group included in a layered structure of an In—Sn—Zn-based oxide. FIG. 16B illustrates a large group including three medium groups. Note that FIG. 16C illustrates an atomic arrangement in the case where the layered structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

When the large group illustrated in FIG. 16B is repeated, crystal of an In—Sn—Zn-based oxide ($In_2SnZn_3O_8$) can be obtained. Note that a layered structure of the obtained crystal of an In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a one-component metal oxide such as an In-based oxide, a Sn-based oxide, or a Zn-based oxide; and the like.

Figure 17A:
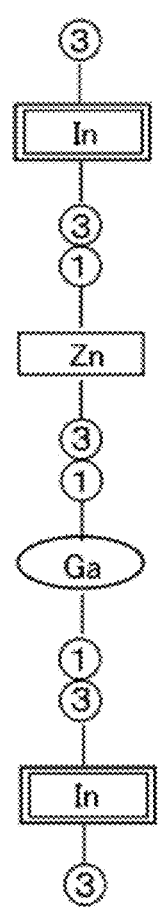
FIGS. 17A to 17C are diagrams illustrating a crystal structure of an oxide material.

For example, FIG. 17A illustrates a model of a medium group included in a layered structure of an In—Ga—Zn-based oxide material.

In the medium group included in the layered structure of the In—Ga—Zn-based oxide material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 17B:
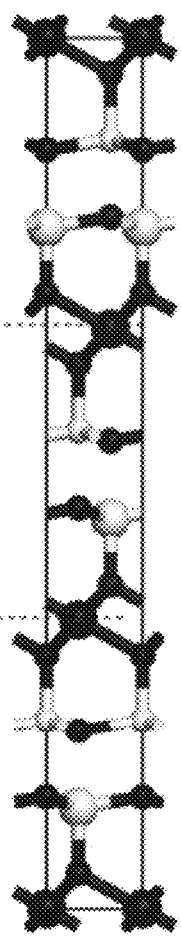
Figure 17C:
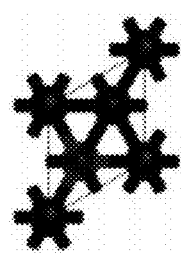

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide material, a large group can be formed using not only the medium group illustrated in FIG. 17A but also a medium group in which the arrangement of the In atom, the Ga atom, and the Zn atom is different from that in FIG. 17A.

This embodiment can be implemented in appropriate combination with any of the structures described in the other embodiments.

Embodiment 4

A display device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 9:
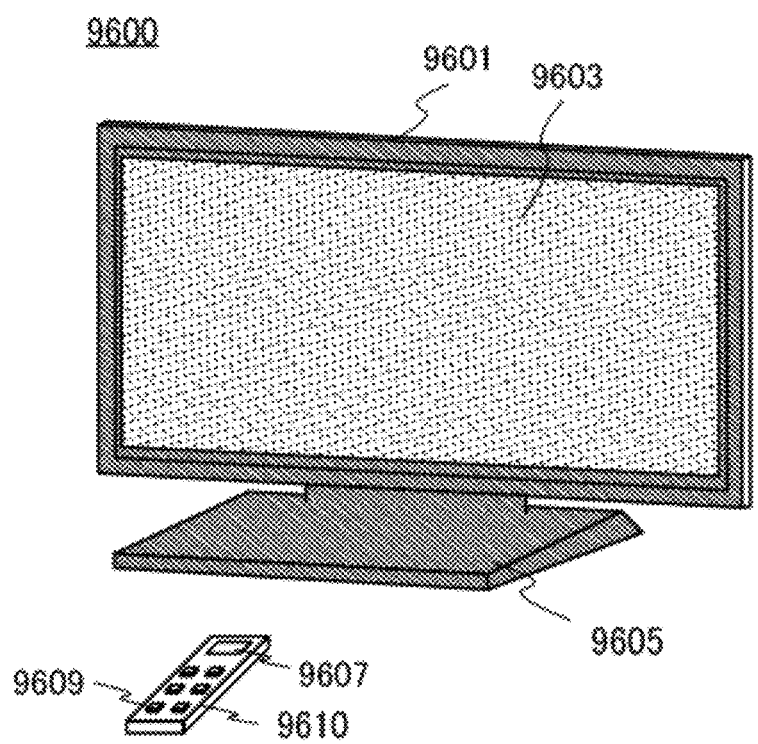
FIG. 9 illustrates an example of an electronic device.

FIG. 9 illustrates a television set 9600 as one example of such electronic devices. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

In the display portion 9603, a plurality of transistors described in Embodiment 2 are provided as switching elements of pixels, and a transistor described in Embodiment 2 is provided in a switch circuit portion formed over the same insulating substrate as the display portion 9603. Accordingly, the television set with a narrow frame can be manufactured.

This embodiment can be implemented in appropriate combination with any of the structures described in the other embodiments.

EXAMPLE 1

In this example, a crystal state of an In—Sn—Zn-based oxide film is described.

First, X-ray diffraction (XRD) analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

First, a quartz substrate which had been subjected to dehydrogenation treatment was prepared.

Next, an In—Sn—Zn-based oxide film with a thickness of 100 nm was formed over the quartz substrate.

The In—Sn—Zn-based oxide film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature in film formation was set at room temperature or 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 10:
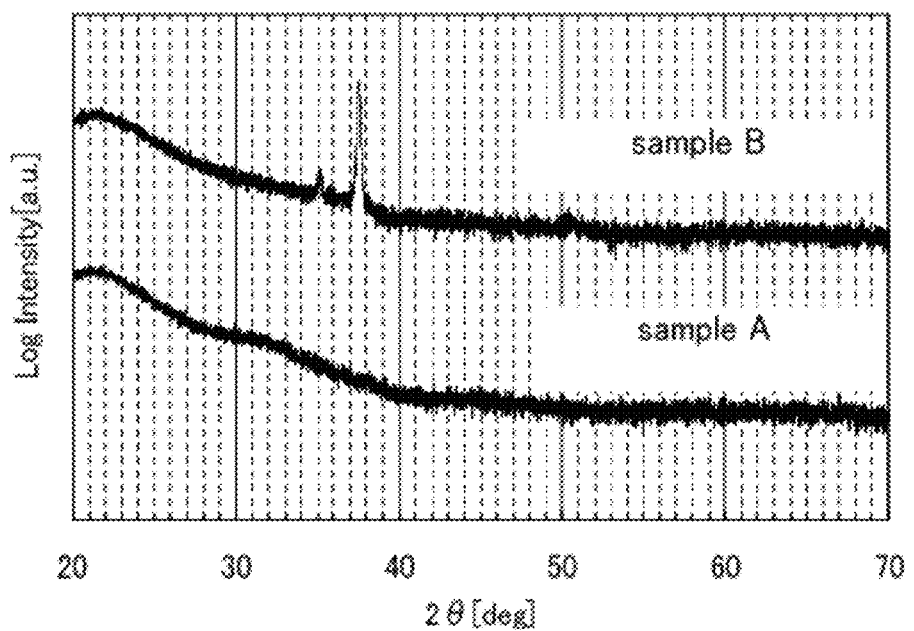
FIG. 10 shows XRD spectra of In—Sn—Zn-based oxide films.

FIG. 10 shows XRD spectra of Sample A and Sample B. No peak derived from crystal was observed in Sample A, whereas peaks derived from crystal were observed when 2θ was around 35 deg. and at 37 deg. to 38 deg. in Sample B.

Figure 19:
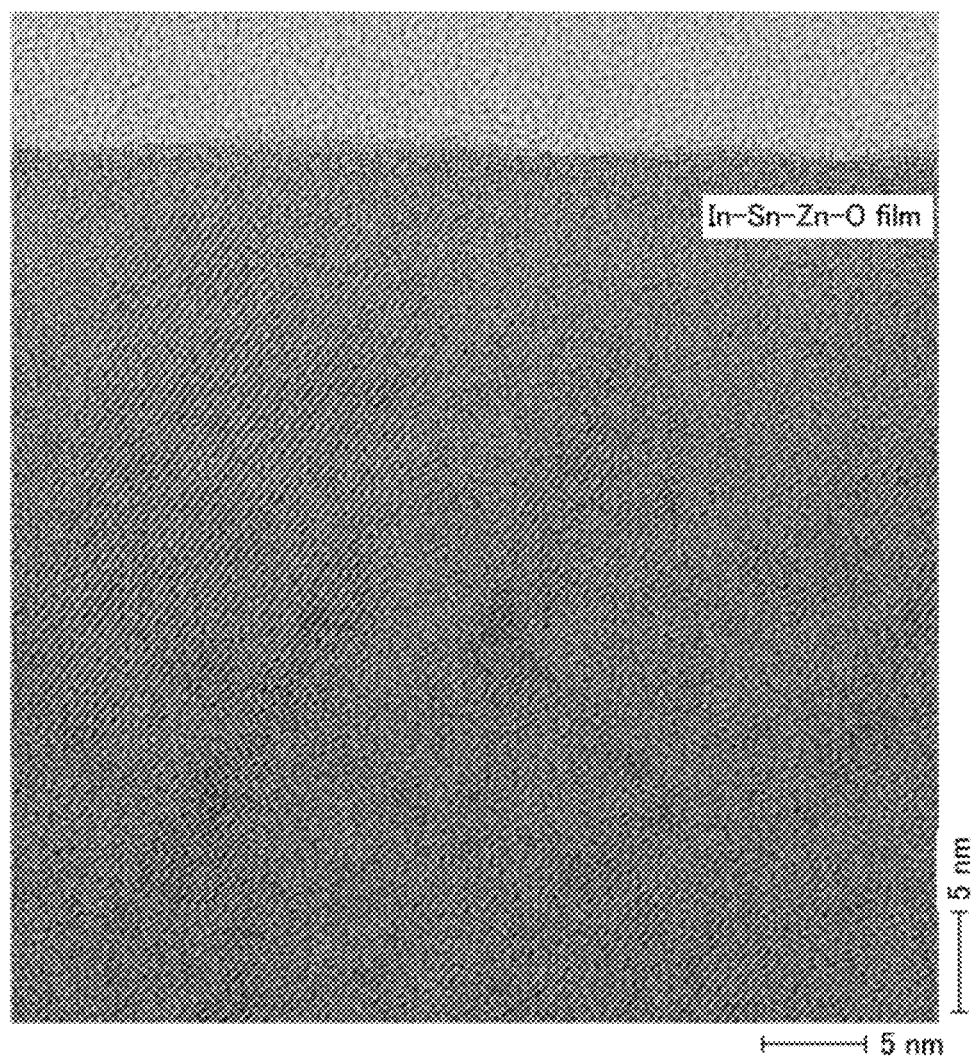
FIG. 19 is a cross-sectional TEM image of an In—Sn—Zn-based oxide film.

FIG. 18 and FIG. 19 are cross-sectional images of Sample B which were obtained with a transmission electron microscope (TEM).

FIG. 18 is a cross-sectional TEM image at a magnification of 0.5 million times, and FIG. 19 is a cross-sectional TEM image at a magnification of 4 million times. Note that H-9000NAR manufactured by Hitachi, Ltd was used as the TEM, and the acceleration voltage was 300 kV.

As can be seen in FIG. 18 and FIG. 19, the In—Sn—Zn-based oxide film of Sample B is polycrystalline, where crystals are oriented in various directions.

This application is based on Japanese Patent Application serial no. 2011-108664 filed with Japan Patent Office on May 13, 2011, the entire contents of which are hereby incorporated by reference.

What is claimed is:

1. A display device comprising:
   a pixel portion configured to receive a video signal; and
   a signal line driver circuit including a switch circuit portion configured to control output of the video signal to the pixel portion, the switch circuit portion including a transistor,
   wherein the transistor comprises:
      an oxide semiconductor layer over a first insulating layer and a second insulating layer, the oxide semiconductor layer including a first region and a pair of second regions with the first region interposed therebetween;
      a gate electrode over the oxide semiconductor layer with a gate insulating film interposed therebetween;
      a first electrode, wherein the first electrode and the first insulating layer overlap with each other with one of the pair of second regions interposed therebetween;
      a second electrode, wherein the second electrode and the first insulating layer overlap with each other with the other of the pair of second regions interposed therebetween; and
      a sidewall insulating layer, wherein the sidewall insulating layer is in contact with a side surface of the gate electrode and one of the first electrode and the second electrode,
   wherein the second insulating layer is embedded in the first insulating layer,
   wherein one surface of the first region is in contact with the first insulating layer, and
   wherein one surface of each of the pair of second regions is in contact with at least the second insulating layer.

2. The display device according to claim 1, wherein a material of the first insulating layer is different from a material of the second insulating layer.

3. The display device according to claim 1, wherein the second insulating layer comprises aluminum oxide.

4. The display device according to claim 1, wherein the first insulating layer comprises a material selected from the group consisting of silicon nitride, silicon oxide, silicon nitride oxide, and silicon oxynitride.

5. The display device according to claim 1, wherein the pixel portion includes a pixel provided with a transistor including an oxide semiconductor layer.

6. The display device according to claim 1, wherein a concentration of alkali metal in the oxide semiconductor layer is lower than or equal to $5 \times 10^{16}$ cm$^{-3}$.

7. The display device according to claim 1, wherein the oxide semiconductor layer is made of an oxide semiconductor containing at least one element selected from the group consisting of In, Sn, and Zn.

8. An electronic device comprising the display device according to claim 1.

9. The display device according to claim 1,
   wherein a concentration of sodium in the oxide semiconductor layer is lower than or equal to $5 \times 10^{16}$ cm$^{-3}$,
   wherein a concentration of lithium in the oxide semiconductor layer is lower than or equal to $5 \times 10^{15}$ cm$^{-3}$, and
   wherein a concentration of potassium in the oxide semiconductor layer is lower than or equal to $5 \times 10^{15}$ cm$^{-3}$.

10. The display device according to claim 1,
    wherein an upper surface of the second insulating layer is flush with an upper surface of a part of the first insulating layer, and wherein the gate electrode does not overlap with the second insulating layer.

11. The display device according to claim 1,
wherein the one surface of each of the pair of second regions is in contact with the first insulating layer and the second insulating layer,
wherein another surface of one of the pair of second regions is in contact with the first electrode, and
wherein another surface of the other of the pair of second regions is in contact with the second electrode.

12. A display device comprising:
a pixel portion configured to receive a video signal; and
a signal line driver circuit including a switch circuit portion configured to control output of the video signal to the pixel portion, the switch circuit portion including a transistor,
wherein the transistor comprises:
an oxide semiconductor layer over a first insulating layer and a second insulating layer, the oxide semiconductor layer including a first region and a pair of second regions with the first region interposed therebetween, wherein the first region has a different conductivity type from the pair of second regions;
a gate electrode over the oxide semiconductor layer with a gate insulating film interposed therebetween;
a first electrode, wherein the first electrode and the first insulating layer overlap with each other with one of the pair of second regions interposed therebetween;
a second electrode, wherein the second electrode and the first insulating layer overlap with each other with the other of the pair of second regions interposed therebetween; and
a sidewall insulating layer, wherein the sidewall insulating layer is in contact with a side surface of the gate electrode and one of the first electrode and the second electrode,
wherein the second insulating layer is embedded in the first insulating layer,
wherein the oxide semiconductor layer comprises a crystal part,
wherein in the crystal part, a c-axis is aligned in a direction parallel to a normal vector of a surface where the oxide semiconductor layer is formed or a normal vector of a surface of the oxide semiconductor layer,
wherein one surface of the first region is in contact with the first insulating layer, and
wherein one surface of each of the pair of second regions is in contact with at least the second insulating layer.

13. The display device according to claim 12, wherein a material of the first insulating layer is different from a material of the second insulating layer.

14. The display device according to claim 12, wherein the second insulating layer comprises aluminum oxide.

15. The display device according to claim 12, wherein the first insulating layer comprises a material selected from the group consisting of silicon nitride, silicon oxide, silicon nitride oxide, and silicon oxynitride.

16. The display device according to claim 12, wherein the pixel portion includes a pixel provided with a transistor including an oxide semiconductor layer.

17. The display device according to claim 12, wherein a concentration of alkali metal in the oxide semiconductor layer is lower than or equal to $5\times10^{16}$ cm$^{-3}$.

18. The display device according to claim 12, wherein the oxide semiconductor layer is made of an oxide semiconductor containing at least one element selected from the group consisting of In, Sn, and Zn.

19. An electronic device comprising the display device according to claim 12.

20. The display device according to claim 12,
wherein a concentration of sodium in the oxide semiconductor layer is lower than or equal to $5\times10^{16}$ cm$^{-3}$,
wherein a concentration of lithium in the oxide semiconductor layer is lower than or equal to $5\times10^{15}$ cm$^{-3}$, and
wherein a concentration of potassium in the oxide semiconductor layer is lower than or equal to $5\times10^{15}$ cm$^{-3}$.

21. The display device according to claim 12,
wherein an upper surface of the second insulating layer is flush with an upper surface of a part of the first insulating layer, and
wherein the gate electrode does not overlap with the second insulating layer.

22. The display device according to claim 12,
wherein the one surface of each of the pair of second regions is in contact with the first insulating layer and the second insulating layer,
wherein another surface of one of the pair of second regions is in contact with the first electrode, and
wherein another surface of the other of the pair of second regions is in contact with the second electrode.

* * * * *